(12) United States Patent
Zhang et al.

(10) Patent No.: US 11,635,699 B2
(45) Date of Patent: Apr. 25, 2023

(54) DETERMINING PATTERN RANKING BASED ON MEASUREMENT FEEDBACK FROM PRINTED SUBSTRATE

(71) Applicant: ASML NETHERLANDS B.V., Veldhoven (NL)

(72) Inventors: Youping Zhang, Cupertino, CA (US); Maxime Philippe Frederic Genin, San Mateo, CA (US); Cong Wu, Shenzhen (CN); Jing Su, Fremont, CA (US); Weixuan Hu, Shenzhen (CN); Yi Zou, Foster City, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/312,709

(22) PCT Filed: Dec. 4, 2019

(86) PCT No.: PCT/EP2019/083585
§ 371 (c)(1),
(2) Date: Jun. 10, 2021

(87) PCT Pub. No.: WO2020/135988
PCT Pub. Date: Jul. 2, 2020

(65) Prior Publication Data
US 2022/0043356 A1    Feb. 10, 2022

Related U.S. Application Data

(60) Provisional application No. 62/785,977, filed on Dec. 28, 2018.

(51) Int. Cl.
*G03F 7/20* (2006.01)

(52) U.S. Cl.
CPC .......... *G03F 7/705* (2013.01); *G03F 7/70675* (2013.01)

(58) Field of Classification Search
CPC .. G03F 7/705; G03F 7/70616; G03F 7/70675; G06N 20/00
See application file for complete search history.

(56) References Cited

U.S. PATENT DOCUMENTS 6,078,738 A * 6/2000 Garza ..................... G03F 1/36
                                                    430/30
6,961,116 B2    11/2005 Den Boef et al.
(Continued)

FOREIGN PATENT DOCUMENTS

TW    201704849    2/2017
WO    2009078708   6/2009
(Continued)

OTHER PUBLICATIONS

International Search Report and Written Opinion issued corresponding PCT Patent Application No. PCT/EP2019/083585, dated May 12, 2020.
(Continued)

*Primary Examiner* — Deoram Persaud
(74) *Attorney, Agent, or Firm* — Pillsbury Winthrop Shaw Pittman LLP

(57) ABSTRACT

Methods for training a process model and determining ranking of simulated patterns (e.g., corresponding to hot spots). A method involves obtaining a training data set including: (i) a simulated pattern associated with a mask pattern to be printed on a substrate, (ii) inspection data of a printed pattern imaged on the substrate using the mask pattern, and (iii) measured values of a parameter of the patterning process applied during imaging of the mask pattern on the substrate; and training a machine learning model for the patterning process based on the training data
(Continued)

set to predict a difference in a characteristic of the simulated pattern and the printed pattern. The trained machine learning model can be used for determining a ranking of hot spots. In another method a model is trained based on measurement data to predict ranking of the hot spots.

20 Claims, 25 Drawing Sheets

(56) References Cited

U.S. PATENT DOCUMENTS

| | | | |
|---|---|---|---|
| 7,587,704 B2* | 9/2009 | Ye | G03F 7/70441 |
| | | | 716/51 |
| 10,514,614 B2 | 12/2019 | Vellanki et al. | |
| 10,755,025 B2 | 8/2020 | Chen et al. | |
| 10,859,926 B2 | 12/2020 | Hunsche et al. | |
| 11,003,093 B2* | 5/2021 | Vellanki | G06N 20/00 |
| 2006/0066855 A1 | 3/2006 | Den Boef et al. | |
| 2008/0183323 A1* | 7/2008 | Menadeva | G06T 7/12 |
| | | | 700/109 |
| 2009/0157360 A1 | 6/2009 | Ye et al. | |
| 2010/0251202 A1* | 9/2010 | Pierrat | G03F 7/70125 |
| | | | 716/50 |
| 2011/0027704 A1 | 2/2011 | Cramer et al. | |
| 2011/0043791 A1 | 2/2011 | Smilde et al. | |
| 2011/0161893 A1* | 6/2011 | Lin | G03F 1/72 |
| | | | 430/5 |
| 2011/0276935 A1* | 11/2011 | Fouquet | G06F 30/398 |
| | | | 716/112 |
| 2012/0151428 A1* | 6/2012 | Tanaka | G01B 15/04 |
| | | | 716/112 |
| 2012/0242970 A1 | 9/2012 | Smilde et al. | |
| 2013/0146763 A1* | 6/2013 | Kawada | G01B 15/00 |
| | | | 382/217 |
| 2016/0313651 A1 | 10/2016 | Middlebrooks et al. | |
| 2018/0173104 A1 | 6/2018 | Hunsche et al. | |
| 2019/0206041 A1 | 7/2019 | Fang et al. | |
| 2019/0228522 A1 | 7/2019 | Shinoda et al. | |

FOREIGN PATENT DOCUMENTS

| | | |
|---|---|---|
| WO | 2009106279 | 9/2009 |
| WO | 2017080729 | 5/2017 |
| WO | 2017171890 | 10/2017 |
| WO | 2017171891 | 10/2017 |
| WO | 2018125219 | 7/2018 |
| WO | 2018125220 | 7/2018 |
| WO | 2018153866 | 8/2018 |
| WO | 2019048506 | 3/2019 |
| WO | 2019162346 | 8/2019 |

OTHER PUBLICATIONS

Taiwanese Office Action issued in corresponding Taiwanese Patent Application No. 108146587, dated Oct. 30, 2020.
Taiwanese Office Action issued in corresponding Taiwanese Patent Application No. 108146587, dated Mar. 3, 2021.
Research Disclosure, "Predict patterning excursions and hot-spots using weighted model", vol. 641, No. 42 (Sep. 1, 2017).

* cited by examiner

DETERMINING PATTERN RANKING BASED ON MEASUREMENT FEEDBACK FROM PRINTED SUBSTRATE

CROSS-REFERENCE TO RELATED APPLICATIONS

This application is the U.S. national phase entry of PCT Patent Application No. PCT/EP2019/083585 which was filed on Dec. 4, 2019, which claims the benefit of priority of U.S. Patent Application No. 62/785,977 which was filed on Dec. 28, 2018 and which is incorporated herein in its entirety by reference.

FIELD

The present disclosure relates to techniques of improving the performance of a device manufacturing process. The techniques may be used in connection with a lithographic apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

In an embodiment, there is provided a method of training a machine learning model of a patterning process. The method includes obtaining a training data set comprising: (i) a simulated pattern associated with a mask pattern to be printed on a substrate, (ii) inspection data of a printed pattern imaged on the substrate using the mask pattern, and (iii) measured values of a parameter of the patterning process applied during imaging of the mask pattern on the substrate; training, via a processor, the machine learning model based on the training data set to predict a difference in a characteristic of the simulated pattern and the printed pattern.

Furthermore, in an embodiment, there is provided a method of correcting a characteristic of a simulated pattern of a patterning process. The method involves determining, via simulating a patterning process model, the simulated pattern and the characteristic of the simulated pattern; determining, via a trained machine learning model, a characteristic adjustment value for the characteristic of the simulated pattern; and correcting, via a processor, the characteristic of the simulated pattern based on the characteristic adjustment value.

Furthermore, in an embodiment, there is provided a method of training a machine learning model configured to predict ranking of a set simulated patterns of a patterning process. The method involves obtaining (i) the set of simulated patterns corresponding to a set of mask patterns, (ii) defect data of a set of printed patterns imaged on a substrate using the set of mask patterns, and (iii) a sampling plan associated with the substrate imaged using the set of mask pattern; and training, via a processor, the machine learning model based on the defect data and the sampling plan such that the machine learning model is configured to predict a ranking of the set of simulated patterns that matches a reference ranking based on the defect data.

Furthermore, in an embodiment, there is provided a method of determining ranking of a set of simulated patterns of a patterning process. The method involves adjusting, via a first machine learning model, a characteristic of at least one simulated pattern within a set of simulated patterns; determining, via a processor, a subset of the simulated patterns based on the adjusted characteristic of the at least one simulated pattern; and determining, via a second machine learning model, a ranking of the at least one simulated pattern within subset of the simulated patterns.

Furthermore, in an embodiment, there is provided a computer program product comprising a non-transitory computer readable medium having instructions recorded thereon, the instructions when executed by a computer system implementing the aforementioned methods.

DETAILED DESCRIPTION

Before describing embodiments in detail, it is instructive to present an example environment in which embodiments may be implemented.

Figure 1:
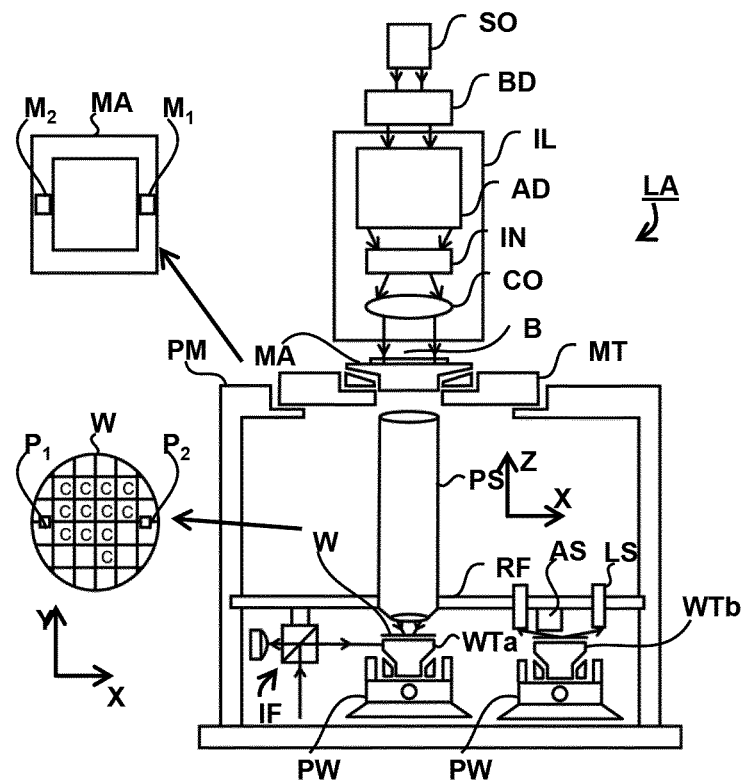
FIG. 1 schematically depicts a lithography apparatus according to an embodiment, according to an embodiment.

FIG. 1 schematically depicts an embodiment of a lithographic apparatus LA. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally, or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basic functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan.

In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. This is non exhaustive list of defects and additional defect types and corresponding defect detectors may be defined. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
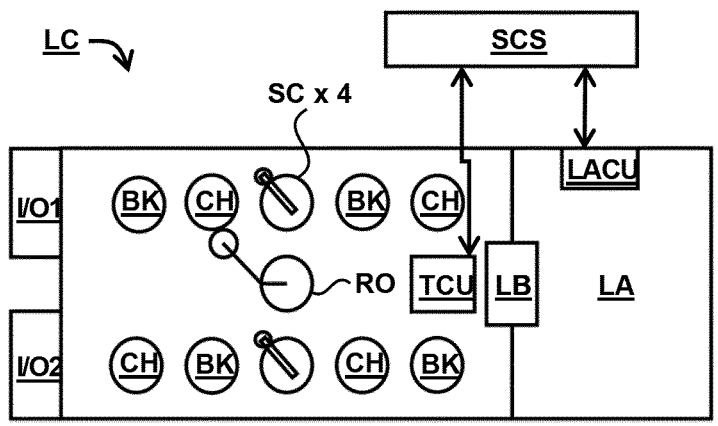
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly, a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
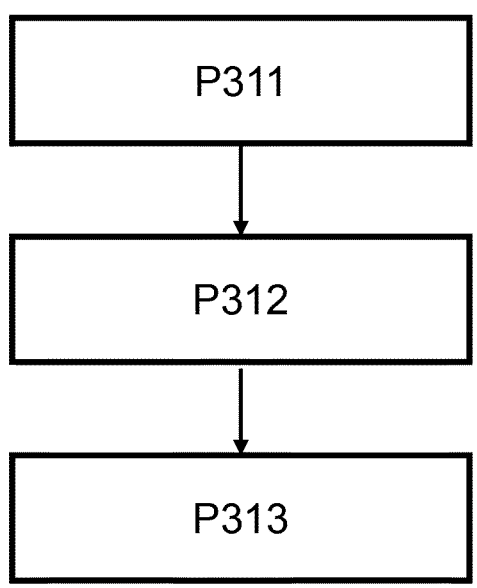
FIG. 3 shows a flow chart for a method of determining existence of defects in a lithography process, according to an embodiment.

FIG. 3 shows a flow chart for a method of determining existence of hot spots (or defects therefrom) in a lithography process, according to an embodiment. In process P311, hot spots or locations thereof are identified using any suitable method from patterns (e.g., patterns on a patterning device). For example, hot spots may be identified by analyzing patterns on a patterning device using an empirical model or a computational model. In an empirical model, images (e.g., resist image, optical image, etch image) of the patterns are not simulated; instead, the empirical model predicts hot spots based on correlations between processing parameters, parameters of the patterns, and the hot spots. For example, an empirical model may be a classification model or a database of patterns prone to defects. In a computational model, a portion or a characteristic of the images is calculated or simulated, and hot spots are identified based on the portion or the characteristic. For example, a line pull back defect/hot spot may be identified by finding a line end too far away from its desired location; a bridging defect/hot spot may be identified by finding a location where two lines undesirably join; an overlapping defect/hot spot may be identified by finding two features on separate layers undesirably overlap or undesirably not overlap. An empirical model is usually less computationally expensive than a computational model. It is possible to determine and/or compile process windows of the hot spots into a map, based on hotspot locations and process windows of individual hot spots—i.e. determine process windows as a function of location. This process window map may characterize the layout-specific sensitivities and processing margins of the patterns. In another example, the hot spots, their locations, and/or their process windows may be determined experimentally, such as by FEM wafer inspection or a suitable metrology tool. A set of defects/hot spots may include those defects/hot spots that cannot be detected in an after-development-inspection (ADI) (usually optical inspection), such as resist top loss, resist undercut, etc. Conventional inspection only reveals such defects/hot spots after the substrate is irreversibly processed (e.g., etched), at which point the wafer cannot be reworked. So, such resist top loss defects cannot be detected using the current optical technology at the time of drafting this document. However, simulation may be used to determine where resist top loss may occur and what the severity would be. Based on this information, it may be either decided to inspect the specific hotspots/possible-defect using a more accurate inspection method (and typically more time consuming) to determine whether the defect/wafer needs rework, or it may be decided to rework the imaging of the specific resist layer (remove the resist layer having the resist top loss defect and recoat the wafer to redo the imaging of the specific layer) before the irreversible processing (e.g., etching) is done.

In process P312, processing parameters under which the hot spots are processed (e.g., imaged or etched onto a substrate) are determined. The processing parameters may be local—dependent on the locations of the hot spots, the dies, or both. The processing parameters may be global—independent of the locations of the hot spots and the dies. One exemplary way to determine the processing parameters is to determine the status of the lithographic apparatus. For example, laser bandwidth, focus, dose, source parameters, projection optics parameters, and the spatial or temporal variations of these parameters, may be measured from the lithographic apparatus. Another exemplary way is to infer the processing parameters from data obtained from metrology performed on the substrate, or from operator of the processing apparatus. For example, metrology may include inspecting a substrate using a diffractive tool (e.g., ASML YieldStar), an electron microscope, or other suitable inspection tools. It is possible to obtain processing parameters for any location on a processed substrate, including the identified hot spots. The processing parameters may be compiled into a map—lithographic parameters, or process conditions, as a function of location. Of course, other processing parameters may be represented as functions of location, i.e., a map. In an embodiment, the processing parameters may be determined before, and preferably immediately before processing each hotspot.

In process P313, existence, probability of existence, characteristics, or a combination thereof, of a defect at a hot spot is determined using the processing parameters under which the hot spot is processed. This determination may be simply comparing the processing parameters and the process window of the hot spot—if the processing parameters fall within the process window, no defect exists; if the processing parameters fall outside the process window, at least one defect will be expected to exist. This determination may also be done using a suitable empirical model (including a statistical model). For example, a classification model may be used to provide a probability of existence of a defect. Another way to make this determination is to use a computational model to simulate an image or expected patterning contours of the hot spot under the processing parameters and measure the image or contour parameters. In an embodiment, the processing parameters may be determined immediately (i.e., before processing the pattern or the next substrate) after processing a pattern or a substrate. The determined existence and/or characteristics of a defect may serve as a basis for a decision of disposition: rework or acceptance. In an embodiment, the processing parameters may be used to calculate moving averages of the lithographic parameters. Moving averages are useful to capture long term drifts of the lithographic parameters, without distraction by short term fluctuations.

In an embodiment, hot spots are detected based on the simulated image of pattern on a substrate. Once the simulation of the patterning process (e.g., including process models such OPC and manufacturability check) is complete, potential weak points, i.e., hot spots, in the design as a function of process conditions may be computed according to one or more definitions (e.g., certain rules, thresholds, or metrics). Hot spots may be determined based on absolute CD values, on the rate of change of CD vs. one or more of the parameters that were varied in the simulation ("CD sensitivity"), on the slope of the aerial image intensity, or on NILS (i.e., "edge slope," or "normalized image log slope," often abbreviated as "NILS." Indicating lack of sharpness or image blur) where the edge of the resist feature is expected (computed from a simple threshold/bias model or a more complete resist model). Alternatively, hot spots may be determined based on a set of predetermined rules such as those used in a design rule checking system, including, but not limited to, line-end pullback, corner rounding, proximity to neighboring features, pattern necking or pinching, and other metrics of pattern deformation relative to the desired pattern. The CD sensitivity to small changes in mask CD is a particularly important lithographic parameter known as MEF (Mask Error Factor) or MEEF (Mask Error Enhancement Factor). Computation of MEF vs. focus and exposure provides a critical metric of the probability that mask process variation convolved with wafer process variation will result in unacceptable pattern degradation of a particular pattern element. Hot spots can also be identified based on variation in overlay errors relative to underlying or subsequent process layers and CD variation or by sensitivity to variations in overlay and/or CD between exposures in a multiple-exposure process.

In an embodiment, pattern fidelity metrology may be performed as guided defect inspection, where simulation tool is used to identify patterns that are likely to fail, which guides the inspection system to locations in wafer where the identified patterns are located to improve efficiency of the inspection system. The inspection system acquires and analyzes pattern/hotspot/defect images on wafer. For example, wafer images may be acquired from reflected image of an optical system (dark field or bright field inspection systems), or electron beam (e-beam) system.

The e-beam system has the advantage of having much higher resolution than optical system, but it's also very slow and scanning the entire wafer image is not practical. To speed up the e-beam inspection (or even the optical system), simulations are configured to guide the inspection system to look at areas on the wafer where the likelihood of defects occurrence is relatively higher within the wafer. By doing so, the inspection process may be speed up by several order magnitudes without loss in defect capturing accuracy.

Each chip design contains huge number of patterns, only a small percent of patterns is likely to result in defect. For example, such patterns are referred as hot spots or hot spot patterns. Defects occur due to process variations (e.g., variations in process parameters such as focus and dose) and hot spots refer to those patterns that may fail first or have higher likelihood of failure due to such process variations. Process simulations may be performed to identify hot spots without requiring actual wafer and the inspection tool.

Thus, guided inspection employs simulation to identify a very small number of hot spots relative to an entire design layout of chip or a wafer, and then drive the inspection system to focus on inspecting areas on a wafer corresponding to hot spot patterns and not inspecting the rest, thereby gaining orders of magnitude throughput gain.

Various aspects of pattern fidelity metrology and methods of hot spot determination or validation are discussed in detail in different patents/patent applications, which are incorporated herein in their entirety by reference. For example, U.S. patent application Ser. No. 15/546,592 describes a process variability aware adaptive inspection and metrology that discusses, for example, a defect prediction method based on variations in process parameters for finding defects. U.S. patent application Ser. No. 15/821,051 describes a hot spot identification based on process window or over lapping process window of an area of interest (e.g., a processing window limiting pattern or hot spot pattern) of a design layout. U.S. patent application Ser. No. 15/580,515 describes methods for defect validation that aligning the metrology image and the first image (e.g., a simulated image) of a wafer and employs verification flow and threshold feedback related to alignment/misalignment of the images. PCT patent application publication WO2017080729A1 describes methods for identifying a process window boundary that improves finding of hot spots.

Existing computational lithography related solutions (e.g., pattern fidelity metrology/monitoring for wafer defect inspection, as discussed earlier) employs modules (e.g., software) such as lithographic manufacturability checks (LMC) based Hotspot Detection which uses computational lithography model to identify hot spots in the full chip to guide an inspection apparatus (e.g., e-beam). The computational lithography software employing such LMC based hot spot detection is also configured to perform beyond OPC verification (e.g., defects related to OPC) and find process window defects and may also generates hundreds of thousands of hot spots for a full chip design. Due to a quick turn-around-time requirement and relatively low speed of making measurements using the inspection tool, inspection of only a small fraction (e.g., thousands out of a million) of the hot spots for full wafer may be performed. To address this problem computation models, employ a ranking indicator (also referred as a rank) to indicate a severity of each hot spots. The severity of hot spot is a measure of how likely the hot spot pattern will transform into real wafer defects. A high severity hot spot means it is likely to transform into defects, and actual counts of such defects associated with the hot spot is likely it be relatively high compared to other patterns. Therefore, such hot spot will also be ranked high. Whereas a low severity hot spots means it is less likely to transform into defects and actual defects counts on wafer will likely to be small or non-existent. Such hot spot will be ranked low.

Based on the ranking, the inspection system may select a small fraction of the hot spots (e.g., hot spots having relatively higher rank) for defect inspection. Therefore, accurate identification of the hot spots and their severity/ranking is important to ensure a high capture rate (i.e., more true positives or more data that reveals defects related to patterns) and low nuisance rate (i.e., less false positive or less data related to non-defective patterns).

As mentioned earlier, measurements via a metrology tool are performed on limited number of selected location (e.g., hot spot locations) on a printed wafer due to an amount of time and resources required to make measurements. In an embodiment, incorrect hot spot ranking may guide an inspection apparatus to less critical (e.g., non-hot spot locations) locations on a printed substrate, thereby spending (or wasting) tool time for inspecting patterns that are unlikely to be real defects. For example, a non-representative measurement sample may include some measurements that may not reveal defects, while some defects may be missed. For example, critical hot spot patterns, which are deemed unlikely to be real defects based on incorrect low ranking of the hot spots, are skipped resulting in real defect being missed, which may result in missing out information related to frequently occurring defects. In an embodiment, the defects missed by guided inspection may be found by other means, i.e., optical inspection systems, dense (vs guided) e-beam inspection. Inaccuracy in simulation which is revealed from measurements (also referred as inaccurate measurements) when (such measurements) used to improve the patterning process, desired result (e.g., desired yield or process improvement) may not be observed.

In an embodiment, after mask design including OPC such as assist features (e.g., SRAF and SERIF), a next step is mask verification such as OPC verification. The mask verification is a standard step in mask data preparation (MDP) flow for reticle tape-out before sending the mask design for manufacturing or fabrication facility. The purpose of such mask verification is to identify errors or weak points in the post-OPC design that would potentially lead to patterning defects on a printed substrate. In an embodiment, such mask verification can be performed using software employing lithographic manufacturability checks (LMC) such as Tachyon software employing LMC rules. The accuracy of the mask verification depends on an accuracy of a patterning process model including an OPC model. Any inaccuracy in the process model results in missing real defects on then substrate or nuisance defects that are not real. In an embodiment, a defect refers to a feature or a portion of the feature that is out of specification when imaged on the substrate. For example, a defect can be necking, hole closure, merging holes, etc.

Some of the defects identified via the LMC are also sent for a substrate inspection or monitoring. In an embodiment, a location on the mask corresponding to the defect identified by LMC is referred as a hot spot. In an embodiment, a hot spot can be defined as a location on the mask having a high likelihood of becoming real defects when a pattern associated with the hot spot is imaged on the substrate.

For example, ASML's pattern fidelity metrology (PFM) product relies on certain patterns or locations thereof (e.g., hot spots) identified by LMC to guide an e-beam inspection apparatus to only particular locations on a printed substrate to improve efficiency of the inspection apparatus. Due to turn-around-time requirement for PFM and the speed of the inspection tool, PFM is only able to inspect a small fraction, usually in thousands, of these locations (e.g., hot spots) of a full printed substrate. To address such inspection problem, mask patterns (e.g., related to the hot spots) identified by LMC need to be ranked based on their likelihood of becoming real defects when imaged on the substrate, and PFM relies on such hot spot ranking to select a small fraction of the hot spots for inspection. Therefore, accurate identification of the hot spots and their severity is one critical step to ensure the high capture rate and low nuisance rate of PFM. In the present disclosure, mask patterns correspond to, as an example, hot spots to explain the concepts, but such use of hot spot does not limit the present disclosure. In the present disclosure, the term "defects" refers to LMC defect (interchangeably referred to as hot spots) when related to mask defects or wafer defects when related to a substrate. A person of ordinary skill in the art may apply the methods of present disclosure to other mask patterns to be inspected.

The process model including the OPC model may not provide accurate results due to several approximations used, for example, to simply or improve speed of a simulation process. In other words, only models do not capture the physics of the process or defects therefrom. Thus, a more conservative approach is used where a tight specification is applied to a pattern or a feature therein so that no potential defects are missed. The consequence however is that a large number of nuisance defects, i.e., hot spots that may not appear on a real printed substrate. Accordingly, the number of hot spots identified based on LMC should be down selected to fit an inspection cycle time budget.

In an embodiment, LMC may be run for each layer of each substrate, thereby reviewing and disposing millions of such defects, which is currently done by human, can be very time consuming. Therefore, it is desired for LMC to reduce the number of the nuisance defects, while identifying most or all real defects. Further, a criticality of a defect may be assessed based on a simulated defect size. In an embodiment, the defect size is defined as a number of defect count on a printed wafer. In an embodiment, the defect size may refer to CD values of patterns printed on the substrate. However, since the process model involves approximations resulting in inaccurate results, the defect size can also have errors.

An error in hot spot identification via LMC will also affect a ranking of the hot spots. When the ranking is not accurate, an inaccurately ranked hot spot list is used for guided inspection resulting in missing a real defect on the printed substrate since they may not be in the sampled hot spot lists, or a large number of nuisance defects may be used that waste inspection time.

Figure 4A:
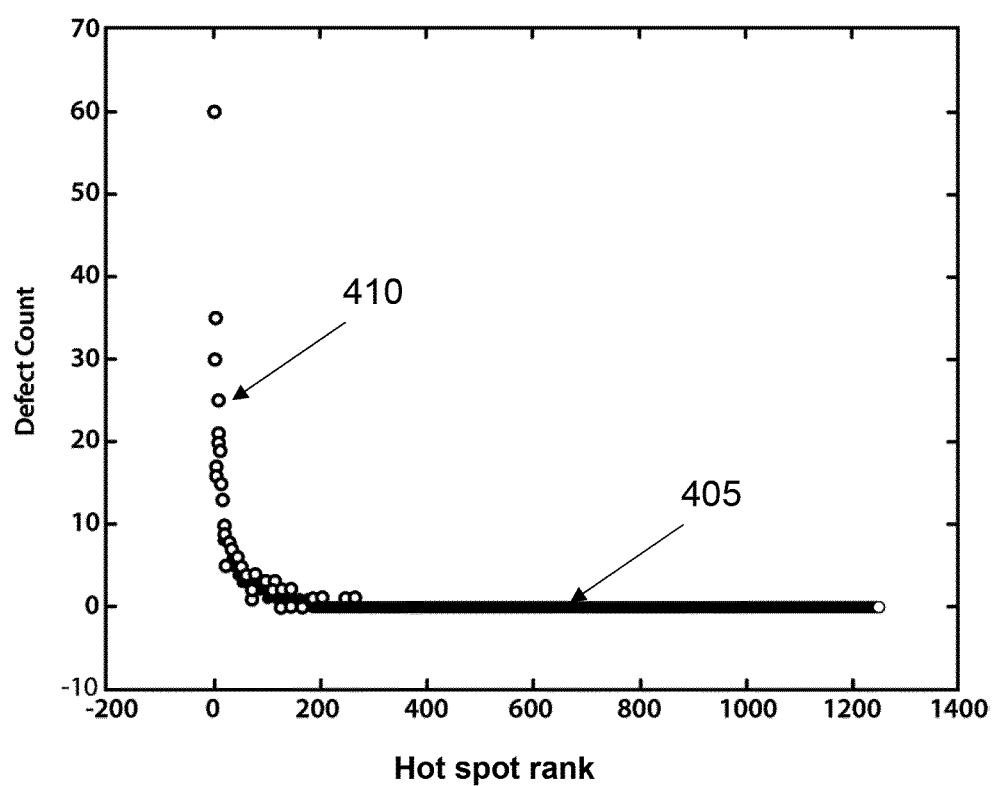
FIG. 4A illustrates example ranking of hot spots assuming an ideal or a perfect patterning process model, according to an embodiment.

FIG. 4A illustrates example ranking of hot spots 410 assuming an ideal or a perfect patterning process model (e.g., including OPC model) that provides an exact correlation between measured defects 410 occurrence from a printed substrate and the ranking of hot spots 405 based on the ideal patterning model. However, the correlation will never be perfect as several process variations causes defects to manifest on the substrate are random in nature. For example, as shown, LMC hot spots ranked 350 and above have no defect occurrences on the printed substrate so hot spots ranked above 350 are nuisance. So, in this situation, ideally LMC should report only the first 350 hot spots.

Figure 4B:
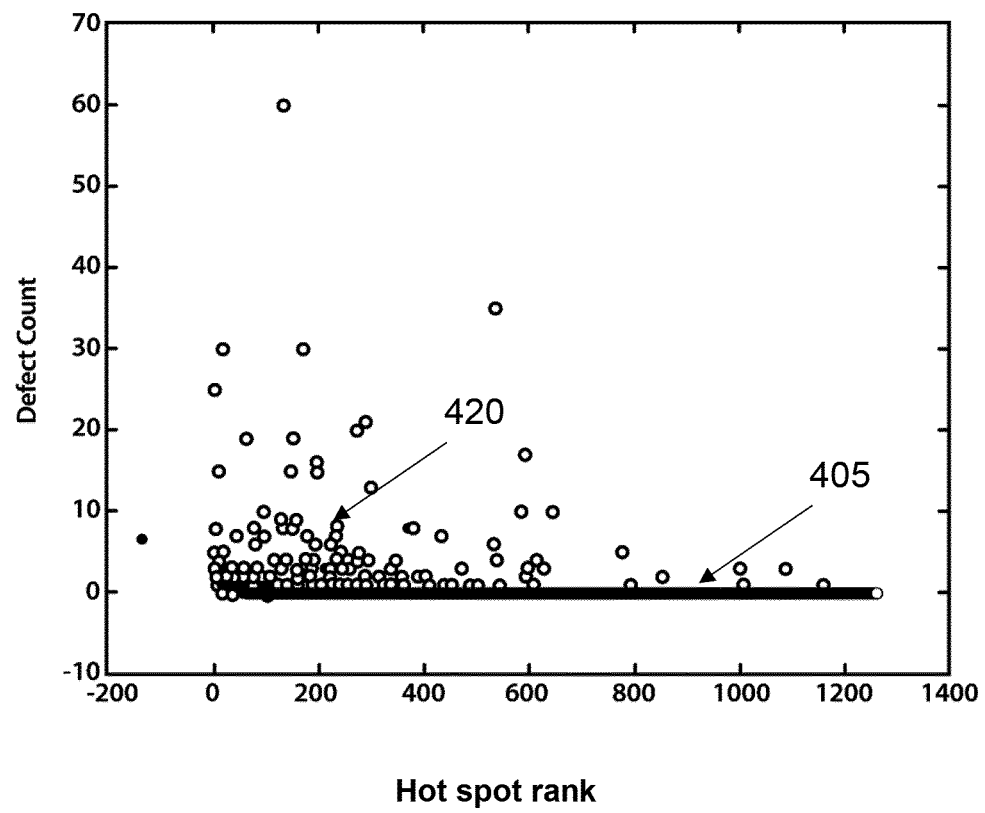
FIG. 4B illustrates example ranking of hot spots based on simulated patterns resulting from existing patterning process model, according to an embodiment.

However, the same LMC check with a less accurate process model results in defects occurrences even for very low ranked hot spots (e.g., hot spots ranked 350 or higher), as shown in FIG. 4B. In FIG. 4B, the ranking of hot spots 420 is inconsistent with measured defect counts. For example, a hot spot ranked lower (e.g., around 600) have higher defect occurrence on the printed substrate, while the hot spot ranked higher (e.g., around 400) has lower defect occurrence on the printed wafer. In other words, ranking of hot spots 420 is reversed or inaccurate. Thus, the plot in FIG. 4B, indicates a poor correlation between the defect data and the ranking of hot spots 420. A poor correlation or inaccurate ranking results in loss of metrology time, low capture rate and high nuisance rate, which are undesirable results. In other words, high number of hot spots sampling may be done in order to capture most of the real wafer defects. Sampling high number of hot spots may lead to high nuisance rate since many hot spots sampled will have low or no real defect occurrences.

So, a feedback from printed substrate must be obtained and fed to the LMC based hot spot ranking so that corrections to the ranking 420 are made and next substrate will be sampled more accurately thereby improving measurement capture rate and low nuisance rate. In other words, more defects will be captured due to improved ranking of the hot spots.

Figure 5:
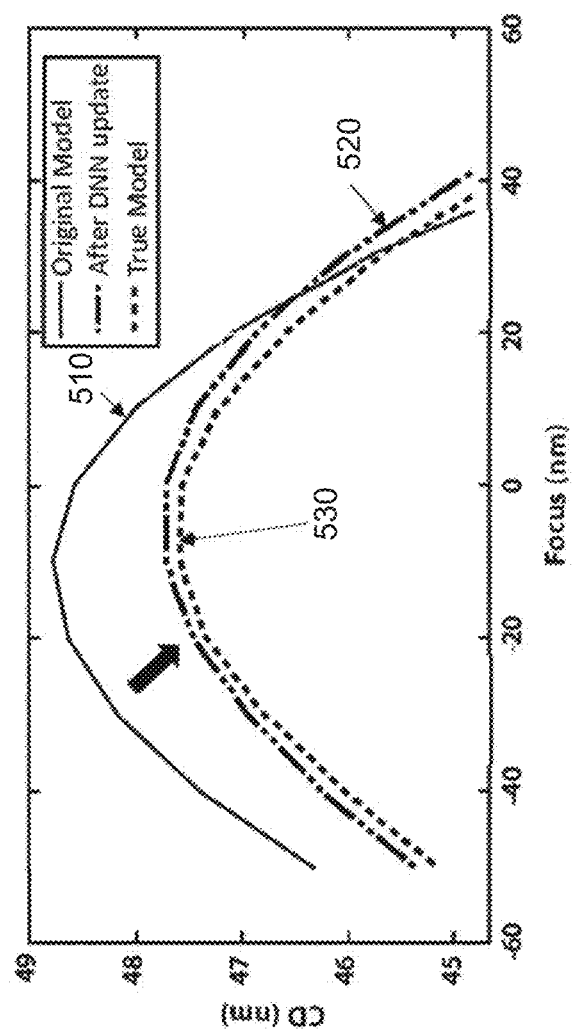
FIG. 5 illustrates values of simulated CD of a simulated pattern as a function of focus compared to a measured CD for a FEM condition, according to an embodiment.

In an embodiment, a model inaccuracy results in inaccurate values of a characteristic (e.g., CD or contour) of a simulated pattern, e.g., corresponding to a hot spot. For example, FIG. 5 illustrates values of simulated CD (i.e., a simulated characteristic) of a simulated pattern as a function of focus compared to a true characteristic (i.e., measured values). In an embodiment, the simulated CD 510 is obtained via simulating a Bossung curve using the dose-focus relationship, or simulating one or more patterning process models (e.g., as discussed in FIG. 22). Such simulated CD 510 is substantially different from a measured CD 520 (i.e., true CD). A difference between the simulated CD 510 and the measured CD 520 is due to model inaccuracies. According to the present embodiment, there is provided a method (e.g., in FIG. 6) to obtain a trained machine learning model configured to determine a correction to the characteristic (e.g., CD) of a simulated pattern. Thus, the simulated CD 510 can be corrected, via the trained machine learning model to obtain a corrected CD 530, or a corrected pattern in general. Such corrected pattern or corrected characteristic of the simulated pattern can be used for various purposes such as hot spot ranking, sampling plan, optimization of process parameters or other patterning related applications.

In an embodiment, a model (e.g., a machine learning model) configured to correct the characteristic of a pattern obtained via simulation corresponding to a mask pattern (e.g., corresponding to a hot spot). In an embodiment, such machine learning model is trained (e.g., as discussed in FIG. 6) based on measurement data that allows accurate correction of the characteristic of a simulated pattern and further more accurate ranking of the hot spots corresponding to the corrected simulated patterns. For example, as illustrated in FIG. 5, the characteristic 510 of the simulated pattern can be corrected via the machine learning model resulting in a corrected simulated pattern or a corrected characteristic 530 thereof.

Figure 6:
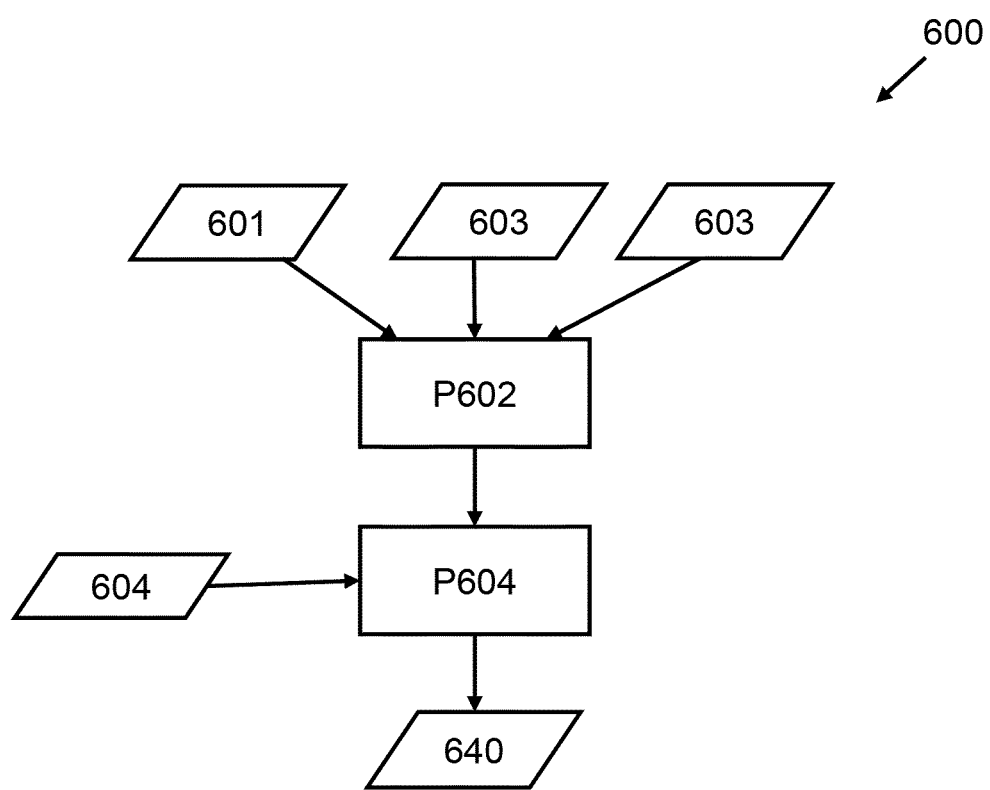
FIG. 6 is a flow chart of a method of training a machine learning model of a patterning process, according to an embodiment.

FIG. 6 is a flow chart of a method 600 of training a machine learning model 604 of a patterning process. The training of the machine learning model 604 is based on measured data such as inspection data and measured values of a parameter (e.g., dose focus, level control, etc.) used during imaging of a mask pattern (e.g., corresponding to a hot spot) on a substrate. In the present disclosure, mask pattern refers to a post OPC pattern i.e., an optimized mask pattern obtained after the OPC process. Using such data from a real printed substrate allows the machine learning model to correct for inaccuracies in the simulated result. In an embodiment, the machine learning model 604 is a convolutional neural network (CNN), deep learning model, or other models. Although today all IC manufacturing in HVM uses photomasks, the present disclosure is not limited to a particular patterning process, the method 600 also applies to other patterning techniques such as direct write process where a photomask is not used.

The method 600, in process P602, involves, obtaining a training data set including (i) a simulated pattern 601 associated with a mask pattern to be printed on a substrate, (ii) inspection data 603 of a printed pattern imaged on the substrate using the mask pattern, and (iii) measured values of a parameter 605 of the patterning process applied during imaging of the mask pattern on the substrate. In an embodiment, the training data set includes a plurality of simulated patterns (e.g., obtained based on measured values of the parameter 605) and measured data (e.g., inspection data, and measured values of the parameters) related to corresponding plurality of printed patterns imaged on the substrate.

Figure 8A:
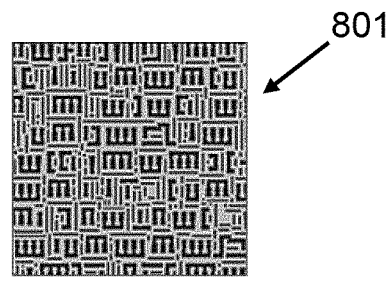
FIGS. 8A, 8B and 8C illustrate example simulated patterns generated during the simulation of the patterning process model, according to an embodiment.
Figure 8B:
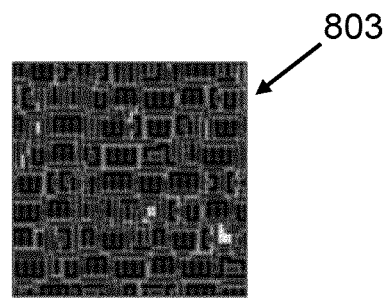
Figure 8C:
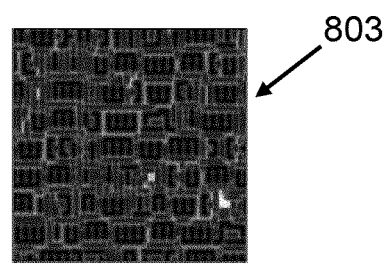

In an embodiment, the simulated pattern 601 is simulated image such as an aerial image, a mask image, a resist image, and/or an etch image. Accordingly, in an embodiment, the obtaining of the simulated pattern 601 involves simulating a patterning process model (e.g., mask model, optics model, resist model, etc.) using the mask pattern (e.g., a portion of design layout corresponding to a hot spot) as an input and manipulating patterning process parameters such as dose, focus, etc. FIGS. 8A-8C illustrate example simulated patterns generated during the simulation of the patterning process model (e.g., as discussed in FIG. 22). For example, the simulated pattern 601 can be a mask image 801, an aerial image 803, and/or a resist image 805. Each such images 801, 803, 805 includes a plurality of patterns, where one or more features may fail or generate a defect on the printed substrate.

In an embodiment, the simulated pattern 601 comprises to a hot spot that is likely to fail when imaged on the substrate. In an embodiment, the simulated pattern 601 comprises a pattern that does not satisfy a lithography manufacturability check when the simulated pattern 601 is imaged on the substrate. For example, certain portions of a curvilinear mask may result in patterns having characteristics that are outside the specification of the CD.

In an embodiment, the inspection data is an image of the printed substrate. In an embodiment, the image is a scanning electron beam image and/or an optical metrology image. The inspection data can be obtained from inspection tool such as optical inspection system (e.g., as discussed in FIG. 15-18), a scatterometer or a e-beam tool (e.g., as discussed with respect to FIGS. 19-20. In embodiment, such inspection data corresponding to the simulated pattern 601 provide basis for modifying model parameters (e.g., weights and biases) of the machine learning model 604 (e.g., CNN) during the training process.

In an embodiment, the measured values of a parameter of the patterning process can be any variable that affects the pattern printed on the substrate. In an embodiment, the measure values of the parameter includes one or more of the measured values of a dose, a focus, MSDx,y, optical parameters or other measured values of parameters of the patterning process applied during the imaging of the mask pattern on the substrate. In an embodiment, printed wafer patterns or printed pattern images 603 are obtained from inspection tool (e.g., SEM) together with values of the corresponding patterning process condition (e.g., measurements of dose and focus). Then, the measured values 605 of the process parameters (or process conditions) are used to simulate the patterning process using patterning process models to obtain the simulated images 601 (e.g., MI/AI/RI). Using these simulated images 601 (e.g., MI/AI/RI) as input and the printed pattern images 603 as ground truth, the machine leaning model is trained by modifying model parameters (e.g., hyperparameters, weights and biases) of the machine learning model 604 (e.g., CNN).

In an embodiment, the measured values of the parameter of the patterning process are obtained via a metrology tool. In an embodiment, one or more metrology tools may be integrated in the lithographic apparatus.

The method 600, in process P604, involves training, via a processor (e.g., processor 104), the machine learning model 604 based on the training data set to predict a difference in a characteristic of the simulated pattern 601 and the printed pattern. At the end of the training process, a trained machine learning model 640 is obtained that is configured to determine a correction to a simulated pattern 601 (e.g., as discussed with respect to FIG. 5).

In an embodiment, the characteristic of the simulated pattern 601 or the printed pattern is a critical dimension of a feature of the simulated pattern 601, or a contour of the feature of the simulated pattern 601. Thus, the trained machine learning model 640 is configured to predict, for example, a CD difference (ACD) between a simulated CD value of the simulated pattern 601 and the measured CD value of the printed pattern. The ACD can be further used to correct the CD of the simulated pattern 601 resulting more accurate value of the CD of the simulated pattern 601. For example, as discussed earlier in reference to FIG. 5, the simulated CD 510 is corrected to CD 530, which is closer to the true CD 520 printed on the substrate.

In an embodiment, the training step (i.e., the process P604) is an iterative process. The training involves receiving the inspection data including the printed pattern and/or a printed pattern image thereof, and the measured values of the parameter of the patterning process; predicting, via the machine learning model, an image corresponding to the simulated pattern 601 based on the inspection data; determining the difference between the predicted pattern image and the printed pattern image; and adjusting model parameter values of the machine learning model such that the difference between the predicted pattern image and the printed pattern image is reduced. In an embodiment, the output of the machine learning model is not limited to an image. The machine learning model may be configured to predict not only a wafer image, but also CD of a feature within the predicted wafer image, an image difference (e.g., difference in pixel values) or a CD difference between the printed image and the predicted image, or other relevant process parameters.

In an embodiment, the adjusting of the model parameter values of the machine learning model involves determining a gradient map of the difference between the predicted pattern image and the printed pattern image as a function of a model parameter; identifying the model parameter values based on the gradient map such that the predicted pattern image and the printed pattern image is reduced; and adjusting the model parameter values based on the identified values.

Figure 9:
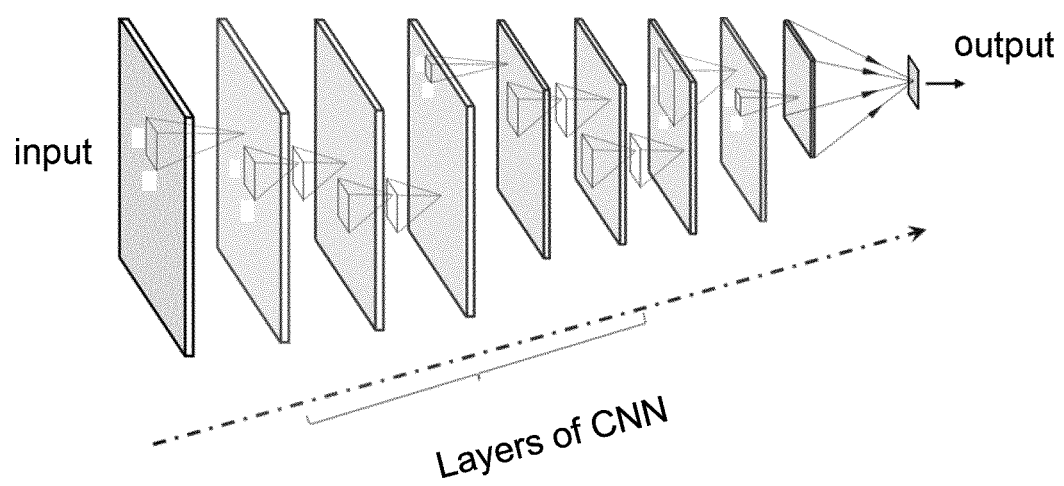
FIG. 9 illustrates an example convolutional neural network (CNN) used as the machine learning model of FIG. 6, according to an embodiment.

In an embodiment, the adjusting of the model parameter values comprises adjusting values of: one or more weights of a layer of the convolutional neural network, one or more bias of a layer of the convolutional neural network, hyperparameters of the CNN and/or a number of layers of the CNN. In an embodiment, the number of layers is a hyperparameter of the CNN which may be pre-selected and may not be changed during the training process. In an embodiment, a series of training process may be performed where the number of layers may be modified. An example of CNN is illustrated in FIG. 9.

In an embodiment, the training (e.g., CNN of FIG. 9) involves determining a value of a cost function and progressively adjusting weights of one or more layers of the CNN such that the cost function is reduce (in an embodiment, minimized). In an embodiment, the cost function is a difference between the predicted pattern (e.g., an output of CNN) obtained from the convolutional neural network and a mask pattern (e.g., pattern from the inspection data, a design layout, etc.). In an embodiment, the cost function may be defined in terms of a contour-based metric, CD, or other suitable geometric or process parameters. The improvement of the cost function is achieved by modifying the values of the CNN model parameters (e.g., weights, bias, stride, etc.)

For example, the cost function may be an edge placement error (EPE). In this case, contours may be extracted from the printed pattern image 603 and the predicted pattern images to further determine the EPE (e.g., difference between a printed pattern contour and a predicted pattern contour). Then, the cost function may be expressed as: cost=f(printed pattern image-CNN(input, cnn_parameters), where the cost may be EPE (or EPE2 or other appropriate EPE based metric), the function f performs contour extraction from the predicted pattern (e.g., by the CNN) and the printed pattern to further determine the difference between predicted pattern image and the printed pattern image. In an embodiment, the input to CNN includes simulated images (e.g., MI/AI/RI). For example, the function f can first derive contours from a predict image and then calculate the EPE with respect to the printed pattern. The cnn_parameters are optimized parameters determined during the CNN training using gradient based method. In an embodiment, the cnn_parameters may be weights and bias of the CNN. Further, a gradient corresponding to the cost function may be dcost/dparameter, where the parameter may be updated based on an equation (e.g., parameter=parameter−learning_rate*gradient). In an embodiment, the parameter may be the weight and/or bias of the machine learning model (e.g., CNN), and learning_rate may be a hyper-parameter used to tune the training process and may be selected by a user or a computer to improve convergence (e.g., faster convergence) of the training process.

The trained machine learning model 640 (e.g., trained CNN of FIG. 9) can be further used for correcting the simulated patterns or any characteristic thereof.

Figure 7:
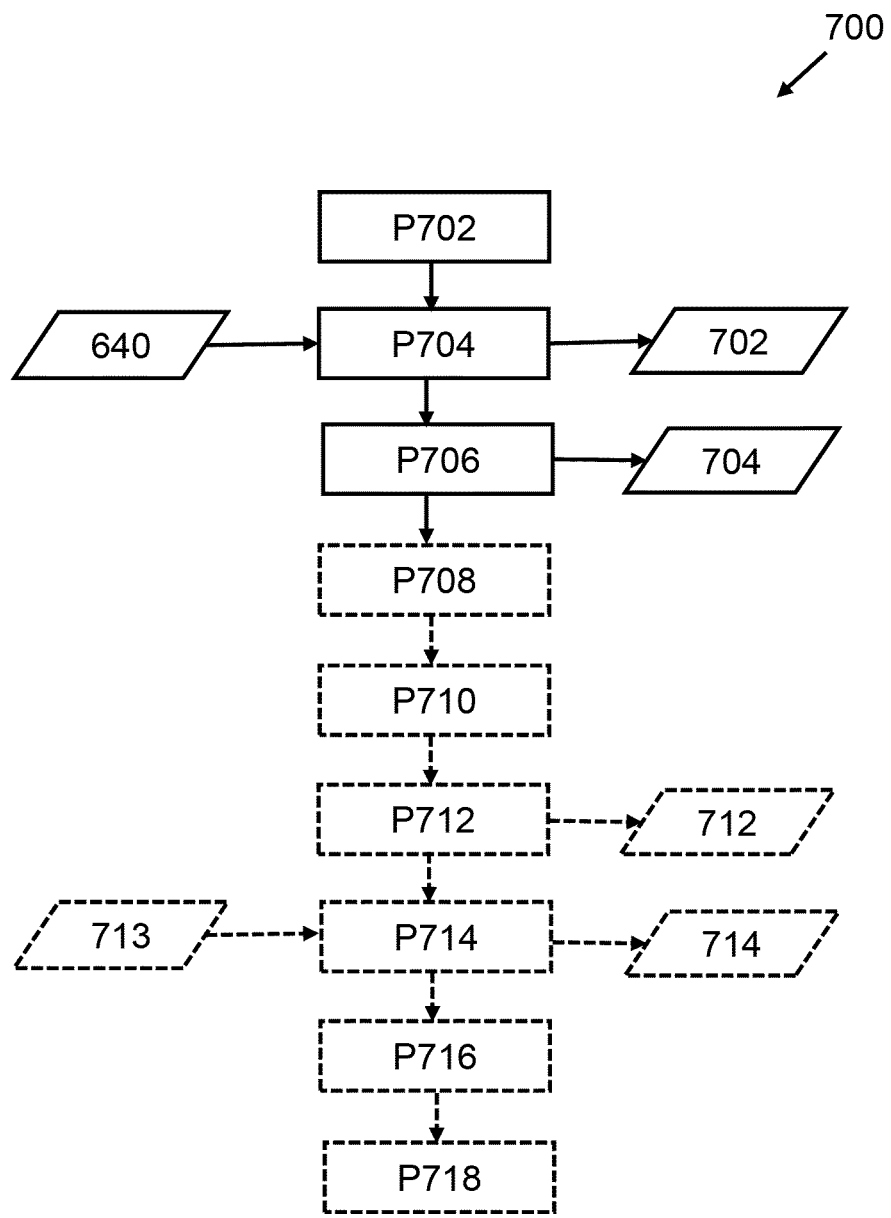
FIG. 7 is a flow chart of a method for correcting a characteristic of a simulated pattern of a patterning process based on a trained machine learning model according to FIG. 6, according to an embodiment.

FIG. 7 is a flow chart of a method 700 for correcting a characteristic of a simulated pattern of a patterning process based on the trained machine learning model (e.g., 640). The method 700, in process P702, includes determining, via simulating a patterning process model, the simulated pattern and the characteristic of the simulated pattern. In an embodiment, e.g., as discussed in FIG. 22, the simulation involves executing a patterning process model (e.g., mask model, optics model, resist model, etc.) using a mask pattern (e.g., a portion of design layout corresponding to a hot spot) as an input. Thereby, the simulated pattern 702 is an aerial image, a mask image, a resist image, and/or an etch image.

The method 700, in process P704, involves determining, via a trained machine learning model (e.g., 640), a characteristic adjustment value 704 for the characteristic of the simulated pattern 702. In an embodiment, a characteristic adjustment value is a value by which a simulated characteristic will be modified to account for inaccuracies of process model. In an embodiment, the trained machine learning model is trained based on simulated patterns and measured data from a printed substrate, so the trained machine learning model is configured to predict such adjustment values for any simulated pattern received as input.

As mentioned earlier, a characteristic of a pattern (e.g., simulated pattern 701 or the printed pattern) may be a critical dimension of a feature, or a contour of the feature. Accordingly, the trained machine learning model 640 predicts, for example, a CD difference (ACD) to be applied to the simulated CD value of the simulated pattern 702 to adjust for any model inaccuracies.

The characteristic adjustment value for the simulated pattern 702 is further used to correct the simulated pattern, in process P706. The process P706 involves correcting, via a processor (e.g., processor 104), the characteristic of the simulated pattern 702 based on the characteristic adjustment value 704. The corrected characteristic or the associated corrected simulated pattern, may be used for various purposes such as ranking a hot spot, optimization of process parameters, controlling parameters of the patterning process or other applications related to improving the patterns printed on the substrate subjected to the patterning process.

In an embodiment, a plurality of simulated patterns may be generated using a plurality of design patterns. For example, typically thousands to millions of simulated patterns may be generated via simulating the patterning process model (e.g., as discussed in FIG. 22). Not each of these may be mask patterns, as several patterns have very low likelihood of failing upon printing on the substrate. Thus, a plurality of simulated patterns may be corresponding to hotspots only (e.g., usually in thousands).

Thus, in an embodiment, the method 700 further comprises, in process P708, obtaining a plurality of simulated patterns and a plurality of adjustment characteristic values corresponding to the plurality of simulated patterns, via the trained machine learning model. In an embodiment, the plurality of simulated patterns comprises patterns corresponding to a plurality of hot spots.

Further, process P710 involves adjusting, via the processor, the characteristic of each of the plurality of simulated patterns based on the plurality of adjustment characteristic values.

Based on the adjusted characteristics of the simulated patterns, a ranking 712 of the plurality of simulated patterns is determined, in process P712. For example, when the characteristics of the plurality of hot spots is adjusted based on the trained machine learning model 640 to account for the inaccuracies in the process model based simulation, one or more hot spots of the plurality of hot spots may no longer be critical (i.e., have a high likelihood of causing a failure on the printed substrate). As such, the ranking 712 based on the adjusted characteristic will be more accurate and only a subset of hot spots that have relatively high likelihood of failure will be analyzed first, thereby improving results of the patterning process. For example, a better sampling plan may be determined based on the ranking 712, thereby improving not only metrology time and resource allocation, but also improves defect capture rate.

In an embodiment, the ranking 712 may be an integer scale from 1 to n, where n is number of total number hot spots. A rank 1 indicates a highest rank, for example, indicative of highest likelihood of failure of associated hot spot, and as the integer value increase, the rank is considered lower, for example, n is the lowest rank. For example, in ranks ranging from 1 to 10, rank 1 is highest and rank 10 is lowest.

Figure 14A:
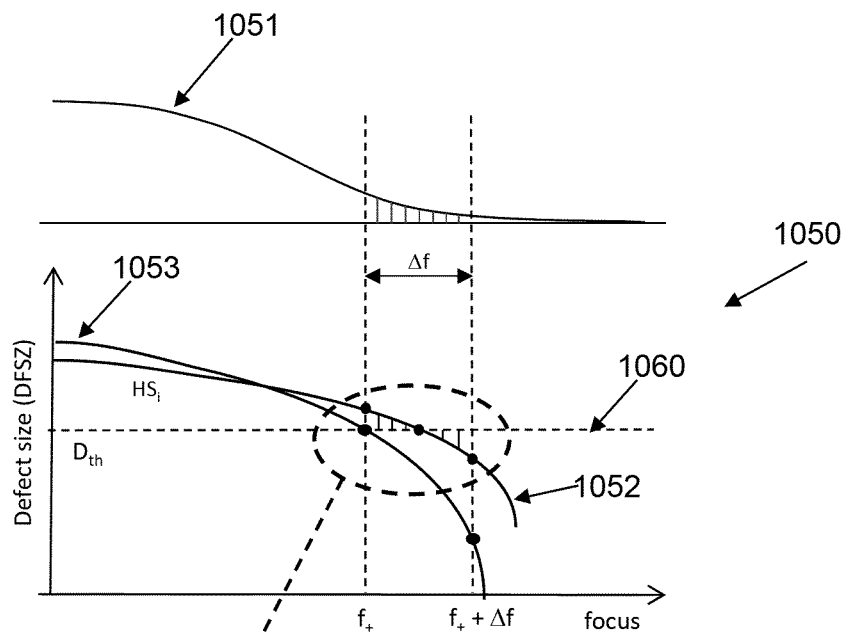
FIGS. 14A and 14B show an example of a ranking algorithm for determining a ranking of hot spots, according to an embodiment.
Figure 14B:
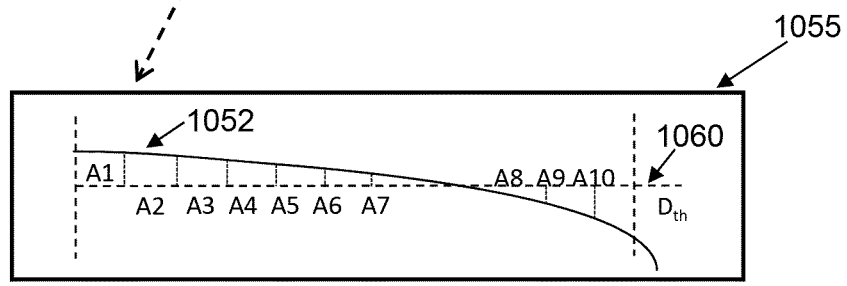

In an embodiment, the determining of the ranking 712 may be based on a ranking algorithm such as in FIGS. 14A and 14B discussed below. In FIGS. 14A and 14B, a ranking is determined, for example, based on a defect metric (e.g., a defect size). For example, based on the defect size, a high rank (e.g., 1) may assigned to a hot spot (or a hot spot pattern) having higher defect size and the ranking algorithm may gradually assign lower rank to other hot spots as the defect size decreases. In an embodiment, the ranking may be based on the total number of defects or a probability of a defect occurrence corresponding to a hot spot being ranked. In an embodiment, the ranking algorithm (e.g., FIGS. 14A and 14B) may be part of the process model or a simulation of the patterning process, thereby the simulation result may be hot spot patterns along with their ranking.

In an embodiment, the ranking 712 may be determined based on another machine learning model 1140 configured to predict ranking based on simulated pattern such as discussed in with respect to FIG. 11 below.

In an embodiment, the method 700 may further comprise, in process P714, determining a sampling plan 714 for metrology of a printed substrate 713 based on the ranking of the plurality of simulated patterns. The determining of the sampling plan 714 identifies location and/or a number of measurements that should be taken at a particular hot spot. In an embodiment, the sampling plan is based on the ranking of the hot spots. For example, the hot spot ranked highest (e.g., rank 1) may be sampled first with relatively high number of measurements so that defects are not missed, as the measurements may be representative of defects that may be found at such location. Similarly, a hot spot ranked relatively lower compared to the highest ranked hot spot, may be sampled later in a sequence of hot spots to be sampled.

The method 700 may further include, in process P716, guiding, via the processor, an inspection apparatus to collect measurement data on the printed substrate based on the ranking 712 of the hot spots. For example, the inspection apparatus (e.g., e-beam tool in FIGS. 19-20) may be directed in a sequence starting from a hot spot having highest ranking to a hot spot having lowest ranking In an embodiment, in addition to the ranking 712 of the hot spots, the guiding (or the related sampling plan) may be based on different parameters (e.g., number of measurements to be make at a particular location, distance between different hot spots, etc.) that optimizes the measurement data and travel time between different hot spots. The present disclosure is not limited to a particular sampling plan determination algorithm or guiding approach, any algorithm may be configured to receive the ranking 712 to determine the sampling plan or the guiding of the inspection apparatus.

Further, based on the measurement data from the inspection too, defects on the printed substrate may be determined, in process P718. In an embodiment, any existing defect detection algorithm may be employed to determine the defects. For example, the defect detection may involve image processing and checks related to specifications of a feature size (e.g., specification related to CD values).

Figure 10B:
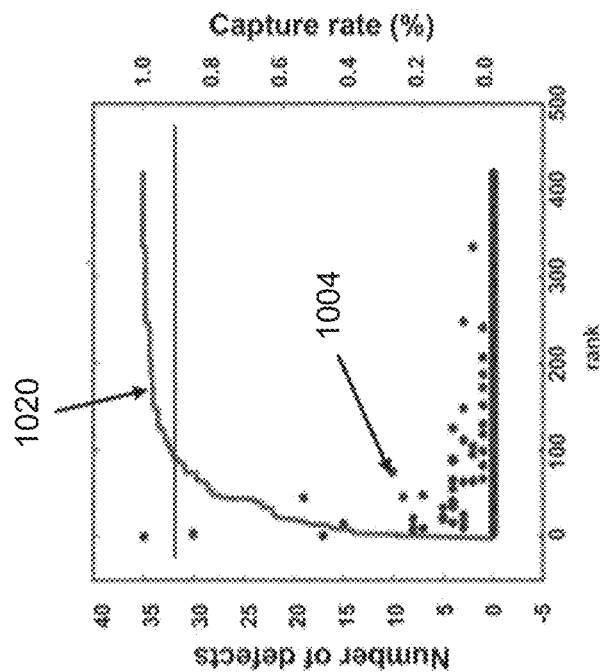
FIG. 10B illustrates example ranking of hot spots based on corrected simulated patterns using the trained machine learning model of FIG. 6, according to an embodiment.
Figure 10A:
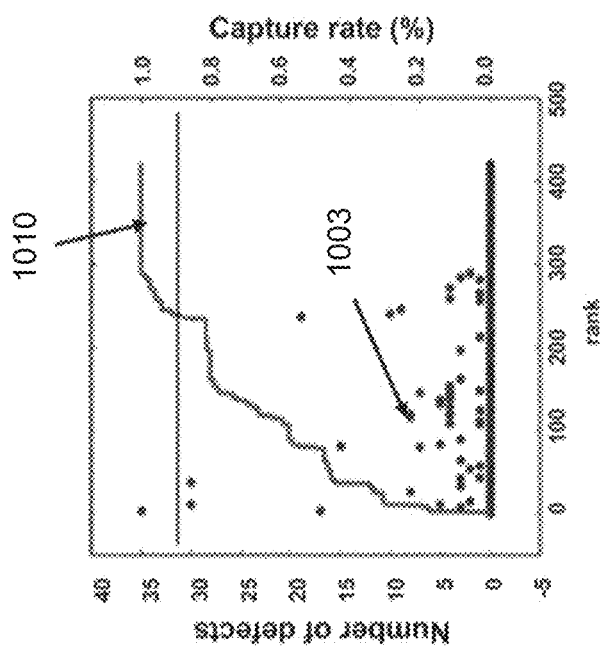
FIG. 10A illustrates example ranking of hot spots based on simulated patterns resulting from existing patterning process model, according to an embodiment.

FIGS. 10A and 10B illustrates example improvement in ranking resulting from feedback (e.g., the adjusted characteristic 704) from the trained machine learning model 640. FIG. 10A illustrates a ranking 1003 of hot spots (x-axis) based on existing results of computational lithographic simulation such as using patterning process models. As shown, the ranking 1003 is inaccurate, since higher ranked hot spots capture less number of defect, while low ranked hot spot show higher number defects. Furthermore, in order to capture more than 90% of defects, as indicated by a capture rate curve 1010, approximately 300 hot spots must be measured.

On the other hand, as shown in FIG. 10B, the ranking 1004 of hot spots is more accurate. Such ranking can be based on adjusted characteristic of the simulated patterns as discussed above. The ranking 1004, of hot spots (x-axis) is such the hot spots ranked relatively higher (e.g., between 1-50) captures most number of defects (y-axis on left) that are likely to occur on a printed substrate. As shown, a curve 1020 indicates a capture rate (y-axis on right). The capture rate curve 1020 indicates that approximately 90% of the total number of defects are captured by first 50 ranked hot spots. Thus, the ranking based on method 700 is an improved ranking compared to an inaccurate ranking, as shown in FIG. 10A, where approximately 300 hot spots must be evaluated to capture approximately 90% defects. For example, measuring time for 50 hot spots will be substantially lower than measuring 300 hot spots for capturing similar number of defects.

Figure 11:
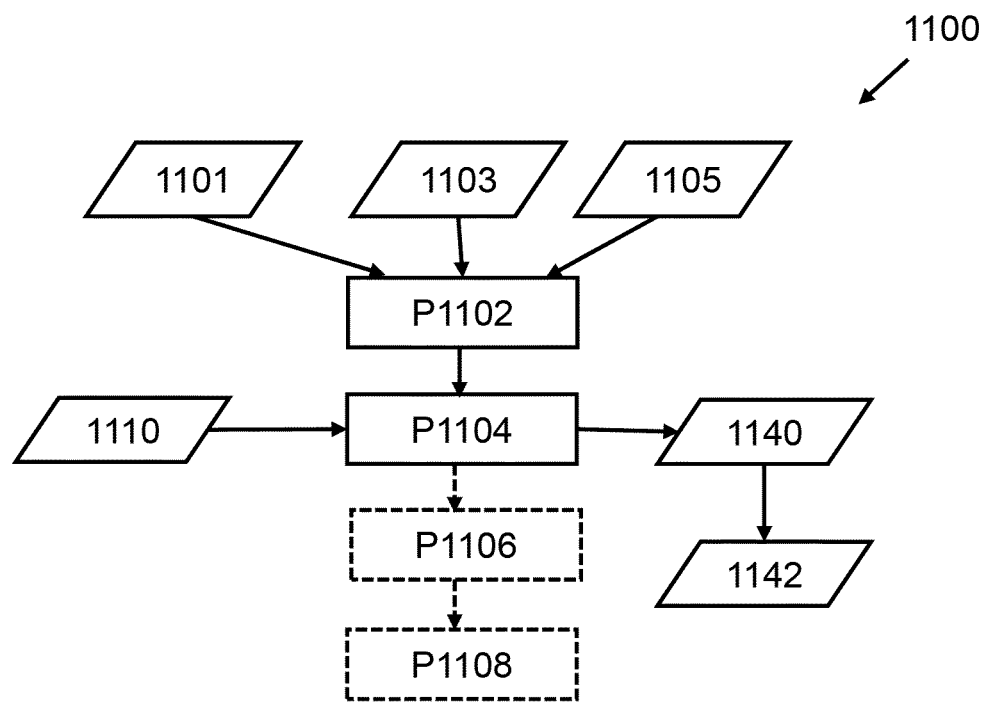
FIG. 11 is a flow chart of a method for training another machine learning model configured to predict ranking of a set simulated patterns of a patterning process, according to an embodiment.

In an embodiment, referring to FIG. 11, there is provided a flow chart of a method for training another machine learning model 1110 configured to predict ranking of a set simulated patterns of a patterning process. The machine learning model 1110 is configured to receive simulated patterns (e.g., MI/AI/RI) or a characteristic (e.g., CD) under patterning process conditions (e.g., Bossung curve, FEM, etc.) as input and predict a ranking or a defect count associated with the simulated pattern as output. In an embodiment, the machine learning model 1110 may be a CNN, a regression model or a classification model with relatively small number of parameters compared to a CNN. After the training process, a trained machine learning model 1140 is generated that is configured to rank at least one simulated pattern of a set of simulated patterns (e.g., obtained via simulating the process models) or corrected simulated patterns (e.g., obtained from method of FIG. 7).

The method 1100, in process P1102, involves obtaining (i) the set of simulated patterns 1101 (e.g., instances of 601 or 702) corresponding to a set of mask patterns, (ii) defect data 1103 of a set of printed patterns imaged on a substrate using the set of mask patterns, and (iii) a sampling plan 1105 associated with the substrate imaged using the set of mask pattern.

In an embodiment, the obtaining the set of simulated patterns 1101 involves simulating a patterning process model (e.g., as discussed in FIG. 22) using each of a mask pattern in the set of the mask pattern, and identifying, from simulation results, the set of simulated patterns 1101 that are likely to fail when imaged on the substrate. Accordingly, the set of simulated patterns 1101 correspond to a set of hot spot patterns. In an embodiment, the set of simulated patterns 1101 comprises a simulated pattern that does not satisfy a lithography manufacturability check.

In an embodiment, the defect data (e.g., obtained via the inspection apparatus (e.g., FIGS. 15-20)) includes features that failed (e.g., out of specification) on the printed substrate. In an embodiment, a defect may be identified by analyzing the SEM image of the printed substrate. Thus, in an embodiment, a total number of defect (i.e., a defect count) associated with a particular pattern (e.g., hot spot) may be determined and further the defect count can be used to correlate with a ranking of the particular pattern (e.g., the hot spot).

In an embodiment, the defect data 1103 is a defect count associated with one or more patterns on the printed substrate. In an embodiment, the defect data 1103 is a value or a range of values of a critical dimension associated with the one or more patterns on the printed substrate. In an embodiment, the defect data 1103 is extracted from image of the printed substrate, wherein the image is a scanning electron beam image and/or an optical metrology image.

In an embodiment, defect data 1103 from a printed substrate is obtained via, a metrology tool (e.g., FIGS. 15-20). In an embodiment, the printed substrate may be measured using the metrology tools (e.g., SEM) and parameters of the patterning process may be extracted from the measurements. For example, contours of patterns may be extracted from an SEM image from the SEM and the contours may be checked against a desired contour or design specification. When the contours do not meet the design specification, the contour is flagged as a defect. In an embodiment, a defect metric based on the defect may be defined to quantify a characteristic (e.g., severity or criticality) of a hot spot and/or for ranking of the hot spots. In an embodiment, the defect metric is any metric related to a defective feature. In an embodiment, the defective feature is a feature that breaches (e.g., exceeds) a desired threshold value of a parameter of the patterning process (e.g., CD<30 nm or CD>30).

In an embodiment, a defect metric can be a defect size, a defect occurrence probability, a defect count related to a particular hot spot, or other defect related metric. A defect size may be defined as a value of a process parameter (e.g., CD) related to a defective feature or a difference between the value of the process parameter with respect to a threshold value. For example, a CD threshold for a bar may be 30 nm and the CD of the bar on the exposed wafer may be 25 nm, then the defect size may be 25 nm or a CD difference i.e., 5 nm. Accordingly, in an embodiment, the defect size related to a hot spot pattern may be used to determine a severity or criticality of the hot spot. In an embodiment, the greater the difference between the defect size and a threshold value, the higher the severity of the hot spot and vice versa.

In an embodiment, the defect metric may be defect count defined as a total number of defect of a particular defect type (e.g., line pull back, hole closure, missing holes, etc.). For example, the total number of defect can be an integer number obtained from counting a particular type of defect.

In an embodiment, the sampling plan 1105 includes a set of locations on the printed substrate at which measurements are made, wherein the set of locations are based on an initial ranking of the set of simulated patterns 1101; and/or a number of measurements to be made at one or more locations of the set of locations based on the initial ranking of the set of simulated patterns 1101.

The method 1100, in process P1104, involves training, via a processor (e.g., processor 104), the machine learning model 1110 based on the defect data 1103 and the sampling plan 1105 such that the machine learning model 1110 is configured to predict a ranking of the set of simulated patterns 1101 that matches a reference ranking based on the defect data 1103. A reference ranking is considered a true ranking since the ranking is based on actual measured defect data from a printed substrate. After the training process, a trained machine learning model 1140 is obtained that can predict a ranking 1142 of any set of simulated patterns 1101 (e.g., instances of 601 or 702). Such ranking will be more accurate as the trained machine learning model includes model parameters adjusted based on real data obtained from a printed substrate.

In an embodiment, the training step is an iterative process. The training process involves predicting, via the machine learning model 1110, the ranking of the set of simulated patterns 1101 using the sampling plan 1105 and the defect data 1103 as input; determining a difference between the predicted ranking and the reference ranking based on the defect data 1103; and adjusting model parameter values of the machine learning model such that the difference between the rankings is reduced.

The method 1100, in process P1106 receiving the set of simulated patterns 1101, and the initial ranking of the set of simulated patterns 1101; predicting, via the trained machine learning model 1140, the ranking 1142 of the set of simulated patterns 1101; and adjusting, via the processor, the sampling plan 1105 based on the predicted ranking 1142 of the set of simulated patterns 1101.

In an embodiment, the adjusting of the sampling plan 1105 involves adjusting a location of the set of location to be measured, and/or the number of the measurements to be made at one or more locations of the set of location to be measured. In an embodiment, the adjusting the location of the set of location involves omitting a location from the set of locations corresponding to a relatively low ranked simulated pattern, and/or adding a new location to the set of locations corresponding to a relatively high ranked simulated pattern. In an embodiment, the adjusting the location of the set of location comprises increasing and/or reducing the number of measurements to be made at the location of the subset of locations.

The method 1100, in process P1108 (similar to process P716 of FIG. 7), involves guiding, via the processor, the inspection apparatus to collect measurement data on the printed substrate based on the predicted ranking 1042 of the set of simulated patterns, and determining, via the processor, defects on the printed substrate based on the measurement data.

Figure 12:
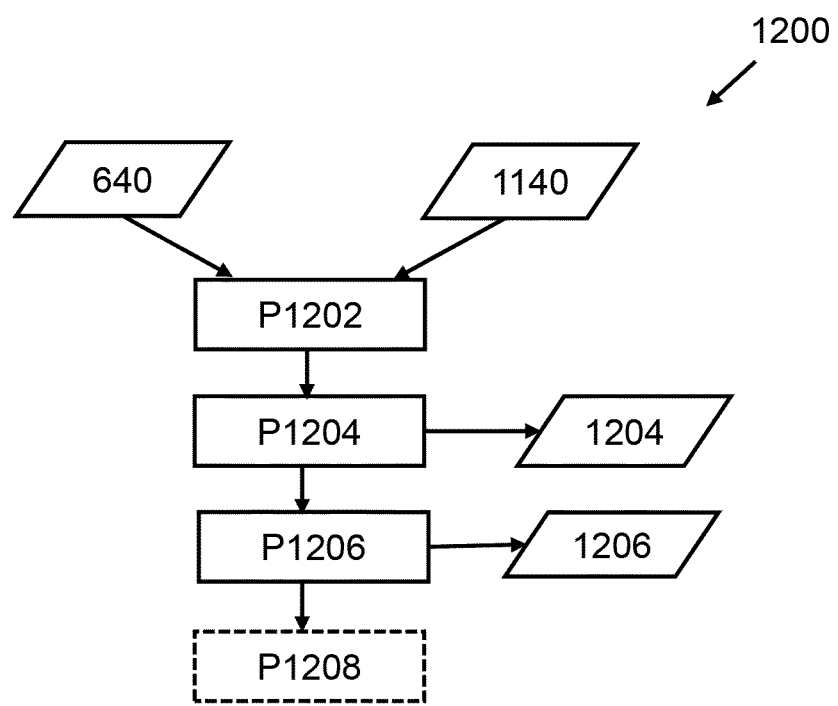
FIG. 12 is a flow chart of a method for determining ranking of a set of simulated patterns of a patterning process based on a first trained machine learning model of FIG. 6 and a second trained machine learning model of FIG. 11, according to an embodiment.

In an embodiment, referring to FIG. 12, there is provided another method 1200 of determining ranking of a set of simulated patterns of a patterning process based on a first trained machine learning model 640 and a second trained machine learning model 1140. In embodiment, a ranking of a set of pattern, for example, comprising hot spots may be improved further when both the trained models 640 and 1140 are combined such that an improved characteristic of the simulated pattern and further ranking based on improved characteristics.

The method 1200, in process P1202, involves adjusting, via a first machine learning model (e.g., 640), a characteristic of at least one simulated pattern within a set of simulated patterns. In an embodiment, the characteristic of the at least one simulated pattern or the printed pattern is a critical dimension of a feature of the at least one simulated pattern of the set of simulated patterns. In an embodiment, the adjusting of the characteristic involves determine a characteristic adjustment value (e.g., ACD) for a simulated characteristic of at least one simulated pattern of the simulated patterns. In an embodiment, the first trained machine learning model 640 is trained based on simulated patterns and measured data from a printed substrate, so the first trained machine learning model 640 is configured to predict such adjustment values for any simulated pattern received as input.

The method 1200, in process P1204, involves determining, via a processor, a subset of the simulated patterns 1204 based on the adjusted characteristic of the at least one simulated pattern. In an embodiment, the determining the subset of the simulated patterns involves determining whether the adjusted characteristic of the at least one simulated pattern satisfy a lithography manufacturability check; and responsive to not satisfying of the lithography manufacturability check, including the at least one simulated pattern in the subset of simulated patterns. For example, an initial set of simulated pattern may include 200,000 hot spots, while after adjusting the characteristic of the simulated patterns one or more simulated pattern may satisfy the LMC check thereby may no longer qualify as hot spot. Hence, such one or more simulated patterns that satisfy LMC may be removed from the 200,000 hot spots and a subset, for example of 2000 hot spots may be obtained. Typically, several of the 200,000 hot spots are nuisance leading to waste of inspection tool time. So, a ranking based on such reduced number of hot spots is desired as it requires less time and results in improved measurement time as well as improved yield due to better capture rate.

The method 1200, in process P1206, involves determining, via a second machine learning model 1140, a ranking 1206 of the at least one simulated pattern within subset of the simulated patterns 1204.

Figure 13:
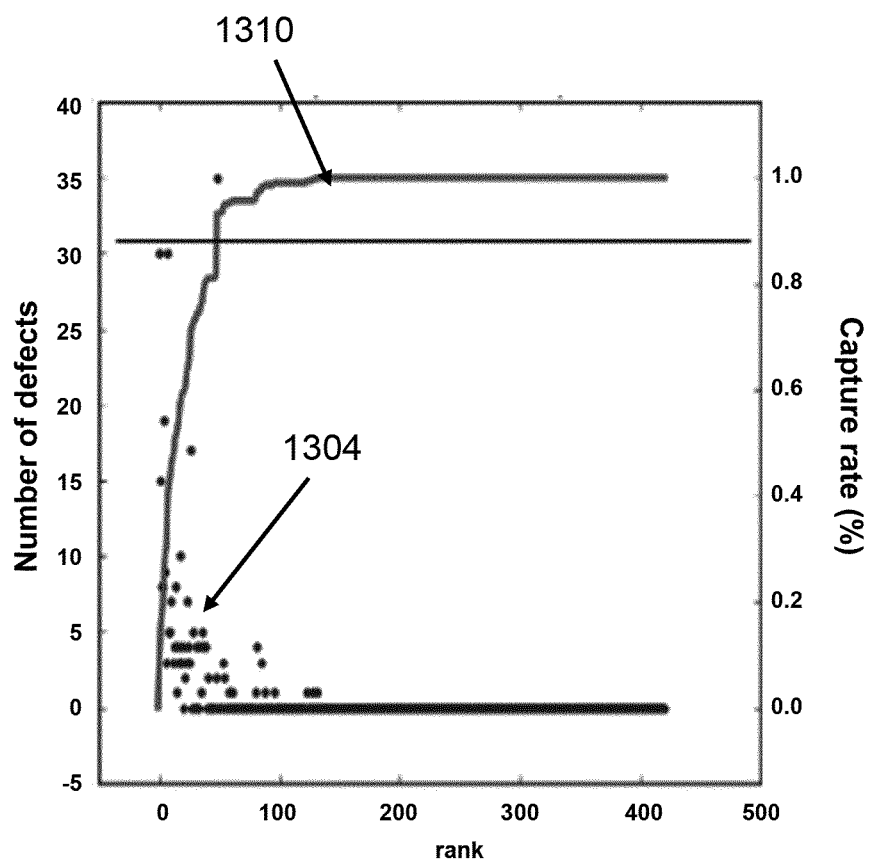
FIG. 13 illustrates example ranking obtained based on the machine learning model of FIG. 11 and associated defect count, according to an embodiment.

FIG. 13 illustrates example ranking obtained based on the machine learning model 1140 and associated defect count. For example, as shown, the ranking 1304, of hot spots (x-axis) is such the hot spots ranked relatively higher (e.g., between 1-50) captures most number of defects (y-axis on left) that are likely to occur on a printed substrate. In an embodiment, the curve 1310 indicates a capture rate (y-axis on right). The capture rate curve 1310 indicates that approximately 90% of the total number of defects are captured by first 50 ranked hot spots. Thus, the ranking based on method 1200 proved better ranking compared to an inaccurate ranking, as shown in FIG. 10A, where approximately 300 hot spots must be evaluated to capture approximately 90% defects. For example, measuring time for 50 hot spots will be substantially lower than measuring 300 hot spots for capturing similar number of defects.

Referring back to FIG. 12, the method 1200, in process P1208, further involves guiding, via the processor, an inspection apparatus to collect measurement data on a printed substrate based on the ranking of the at least one simulated pattern within the subset of simulated patterns; and determining, via a processor, defects on the printed substrate based on the measurement data.

The above methods provide several advantages. For example, the machine learning models or the trained machine learning models (e.g., 640, 1140) may be employed within a computation lithography product (e.g. Tachyon employing LMC), without requiring changes of production OPC model. Employing such machine learning models do not incur a baseline shift and dramatically improves tool availability time. For example, baseline involves a qualified baseline (e.g., model, recipes, etc.) that will be employed for the patterning process and changes to such baseline usually involves re-qualification of such model and recipes, which is not preferred since the re-qualification process requires significant effort and is time consuming. For example, a baseline OPC may be established using existing patterning process model. Although the existing process model is not perfect, determining OPC and related patterning process verifications (e.g., patterning process recipes) using such OPC involves substantial effort.

The machine learning model 1140 ranks hot spot severity and likelihood of becoming real defects more accurately. This requires no specific prior knowledge of all the contributing factors to defects, as the model will "learn" such factors over time. Both the machine learning models (e.g., 640 and 1140) are adaptive, allowing LMC to get more and more accurate over time as more designs are passed through production and more measurement feedbacks are provided from printed substrates.

On the other hand, a classical approach is to re-calibrate the process models (e.g., OPC) for LMC capability. However, such approach has several drawbacks: the model calibration is a time-consuming exercise with specific skills requirement, not practical for PFM users. A feedback from printed wafers can come at regular basis, but recalibrating model regularly is not practical. Recalibrating a process model would require a baseline shift which may be undesirable.

FIGS. 14A and 14B show an example of a ranking algorithm for determining a ranking of the hot spots. In an embodiment, the example ranking algorithm is based on Bossung plot 1050 that defines the relationship between a defect size and a parameter of the patterning process. For example, the ranking is based on a relationship between the defect size (e.g., CD values or CD difference with respect to a threshold) and the focus values. The defect relationship depends on the type of pattern (e.g., different hot spots). Accordingly, different hot spots may exhibit different defect behavior with respect to a change in the focus values. In an embodiment, as the focus increases (e.g., left to right along the x-axis of plot 1050) the defect size decreases (e.g., see 1052 or 1053). For example, for a first hot spot, a first relationship 1052 may indicate an inverse of probability of a defect occurrence as the focus values change. Similarly, for a second hot spot, the second relationship 1053 may indicate an inverse of probability of a defect occurrence as the focus values change. In an embodiment, the second relationship 1053 may correspond to a maximum limiting condition for a process window. In other words, the second hot spot impose constraints on outer limits of, for example, CD values and corresponding dose/focus values. Such second hot spot may result in highest probability of defect and thus ranked highest.

Typically, during the substrate manufacturing, the focus values vary resulting in a variation in the CD printed on the substrate. Thus, in an embodiment, a probability distribution 1051 of a focus value may be used to define a range within which a defect size may be computed for a particular hot spot. In an embodiment, the probability distribution 1051 may be a Gaussian distribution, i.e., a normalized distribution, within a selected range. In an embodiment, the selected range may correspond to a positive focus range defined as boundary values f+ and f++Δf; where f+ is a lower limit and f++Δf is an upper limit. Then, the ranking algorithm may determine the defect size within the selected positive focus range (e.g., 1055). For example, based on the relationship (e.g., 1052 or 1053), the defect size may be computed within the focus range 1055.

As mentioned earlier, in an embodiment, the ranking may be computed based on a defect size with respect to a defect threshold (e.g., minimum allowable CD limit). In an embodiment, the defect threshold may be based on a desired yield (e.g., 99.9%). For example, the defect size may be computed about the defect threshold 1060, as illustrated in FIG. 14B.

In an embodiment, a defect size of a hot spot may be defined as a sum of the product of focus value probability and a difference between defect occurrence for a hot spot and the defect threshold. For example, the defect size may be computed based on following equations:

$$\Delta DFSZi = \Sigma j(\text{focus value probability})j(DFSZij - D\text{th}) = A1 \times W1 + A2 \times W2 + \ldots + A10 \times W10$$

Where, $\Delta DFSZi$ is an expected defect size for an i-th hot spot Hi that is most likely to print in focus uncertainty range; $DFSZij$ is a defect size for i-th hot spot at j-th focus value, and Dth is the defect threshold. Further, as illustrated in FIG. 14B, values A1-A10 may be a difference between the defect relationship (e.g., 1052) and the defect threshold, and W1-W10 may be probability of focus values computed from, for example a normalized focus values within the selected focus range. In an example, $A1\text{-}A7 > 0$, $A8\text{-}A10 < 0$, and $W1 > W2 > W3 \ldots > W10$.

Based on the above equations, defect size for one or more hot spots of a set of hot spots (e.g., 4001 or 5001) may be determined. Further, a hot spot having highest defect size may be assigned a highest rank (e.g., rank 1). For example, the second hot spot (corresponding to 1053) may be assigned rank 1, the first hot spot may be assigned a rank 2, a third hot spot may be assigned a rank 3, and so on. According to an embodiment, the ranking is dependent on accuracy of the defect relationship (e.g., 1052 and 1053) and focus values. As such, if the relationship changes, the ranking will change. In an embodiment, the adjusted values (e.g., from method 4000 or 5000) of the focus and/or defect relationship based on the measurement feedback (e.g., 4008 or 5004) may result in accurate ranking of the hot spots. For example, in an embodiment, the Bossung curve may be adjusted based on a bias function (e.g., FIG. 9A), which may effectively affect the ranking of the hot spots.

Figure 15:
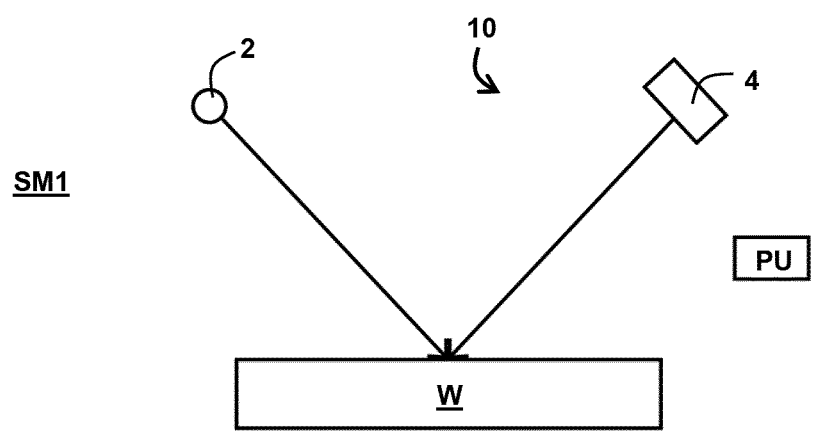
FIG. 15 schematically depicts an example inspection apparatus and metrology technique, according to an embodiment.
Figure 15:
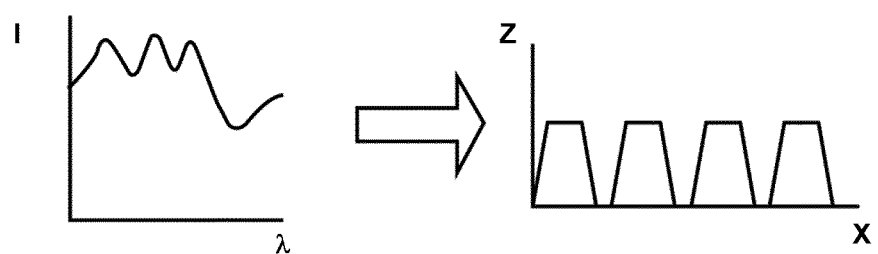

FIG. 15 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 19. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 16:
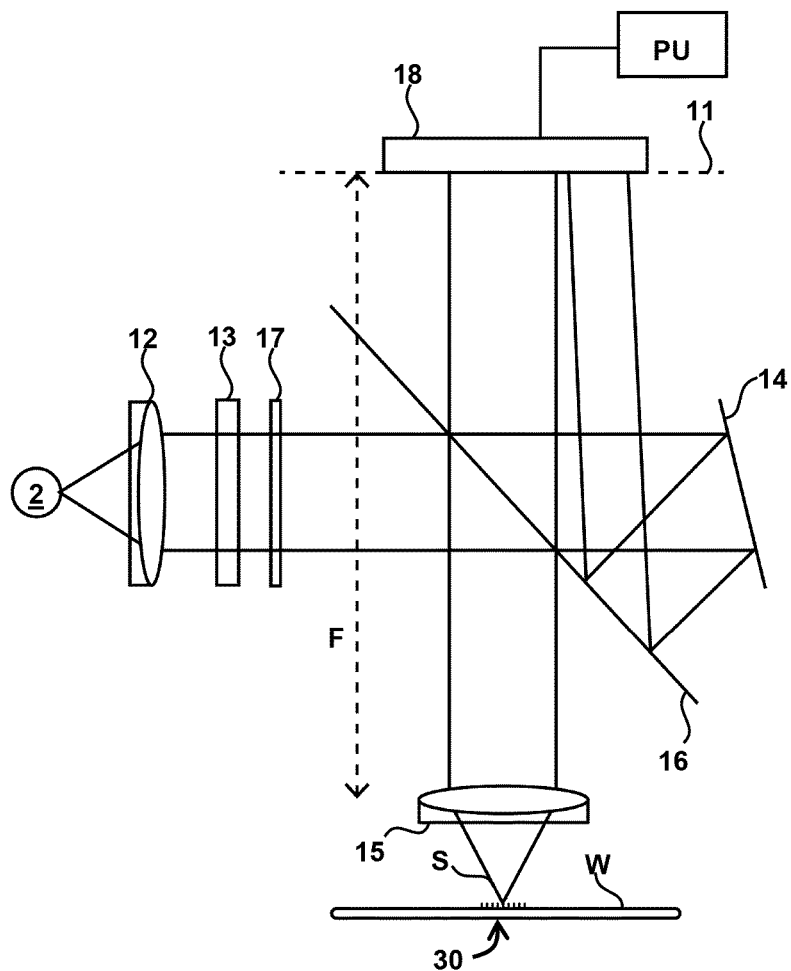
FIG. 16 schematically depicts an example inspection apparatus, according to an embodiment.

Another inspection apparatus that may be used is shown in FIG. 16. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically, many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 15 (i.e., at the focal length of the lens system 15) or the plane 15 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 15 or FIG. 16 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 16, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 17:
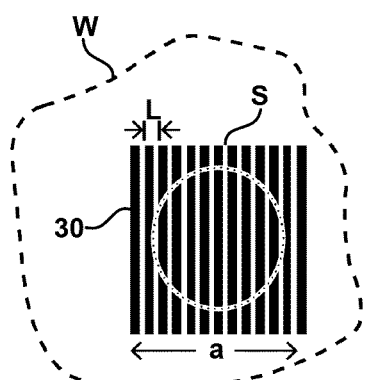
FIG. 17 illustrates the relationship between an illumination spot of an inspection apparatus and a metrology target, according to an embodiment.

FIG. 17 illustrates a plan view of a typical target 30, and the extent of illumination spot S in the apparatus of FIG. 16. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 18:
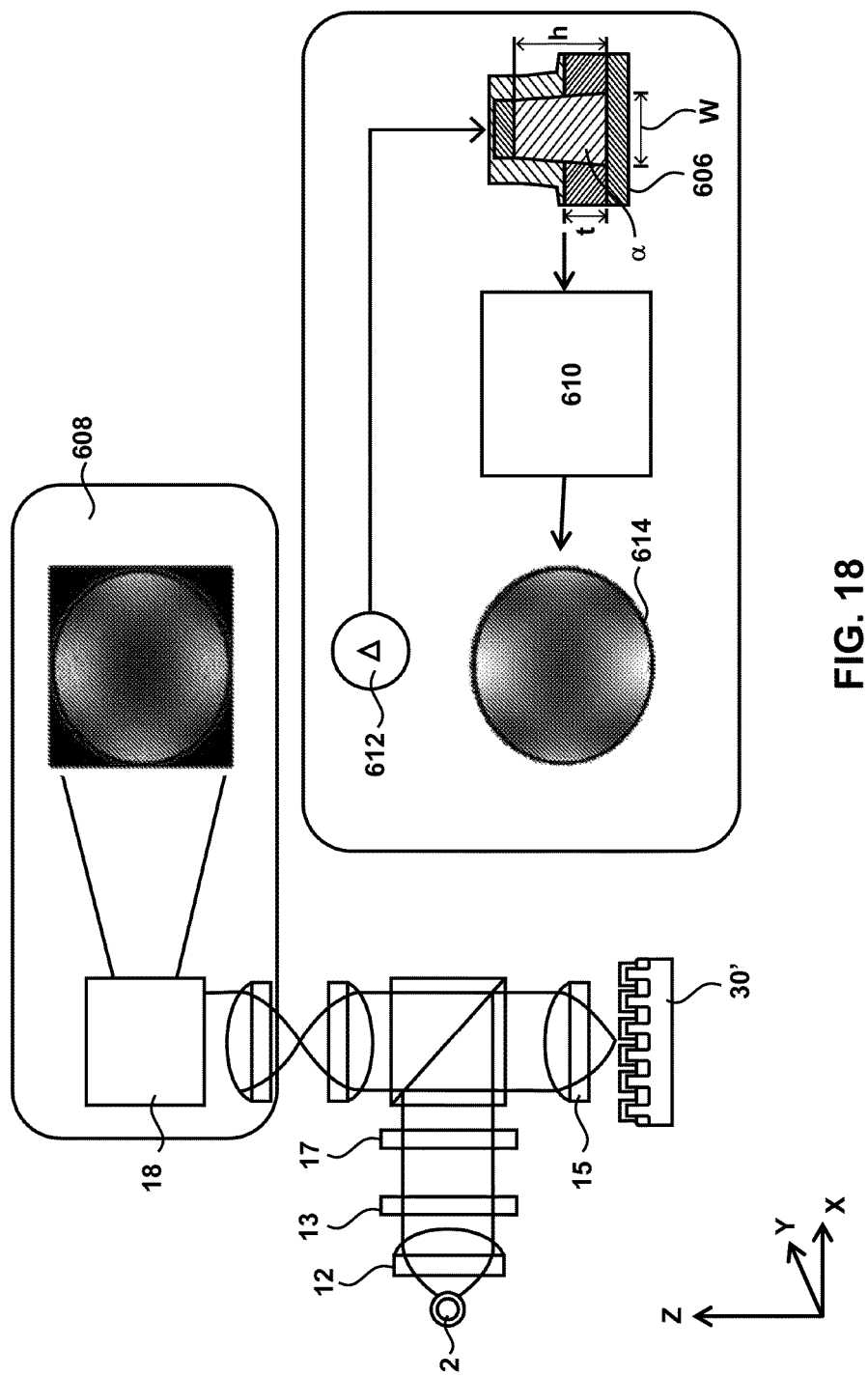
FIG. 18 schematically depicts a process of deriving a plurality of variables of interest based on measurement data, according to an embodiment.

FIG. 18 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 18, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 19:
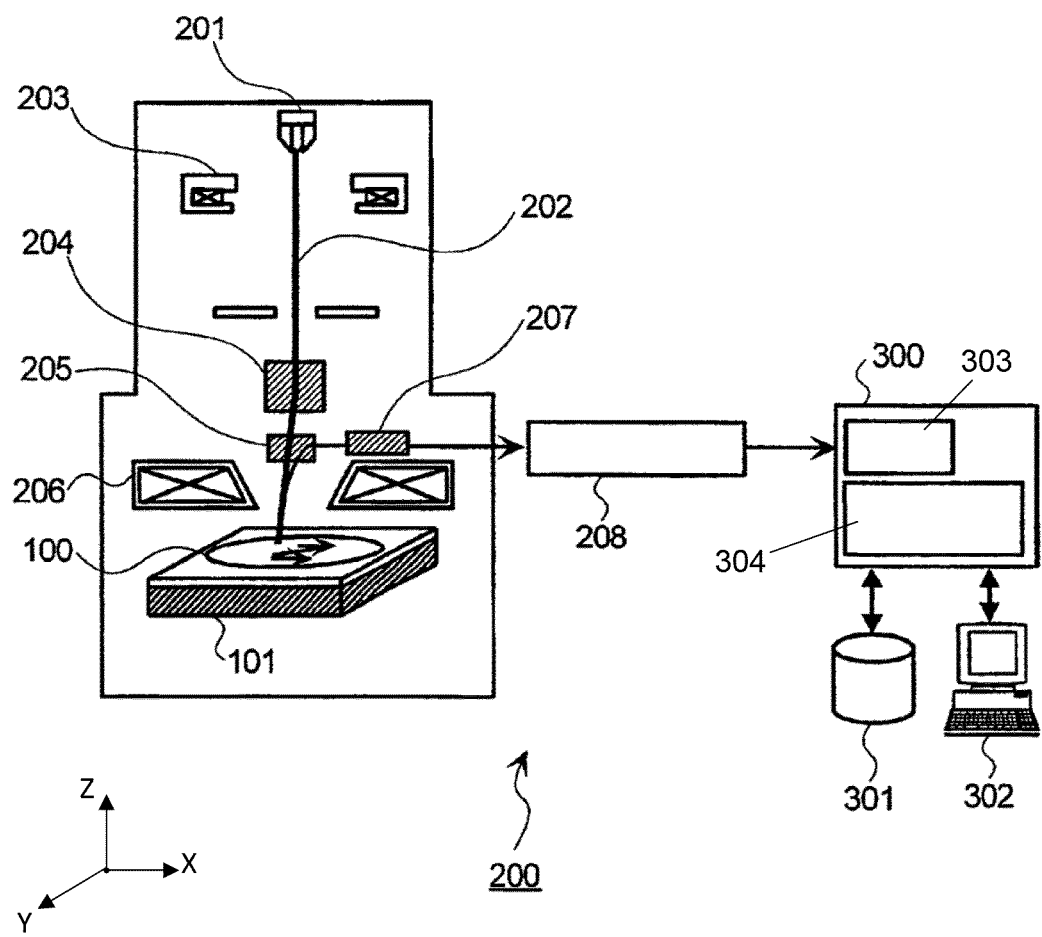
FIG. 19 schematically depicts an embodiment of a scanning electron microscope (SEM), according to an embodiment.

FIG. 19 schematically depicts an embodiment of an electron beam inspection apparatus 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 204 can provide the electron beam 202). Thus, the spatial extent of the field of the view is the spatial extent to which the angular range of the electron beam can impinge on a surface (wherein the surface can be stationary or can move with respect to the field).

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software or a computer readable medium comprising software) is configured to convert or process the digital images into datasets representative of the digital images. In an embodiment, the processing unit 304 is configured or programmed to cause execution of a method described herein. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Figure 20:
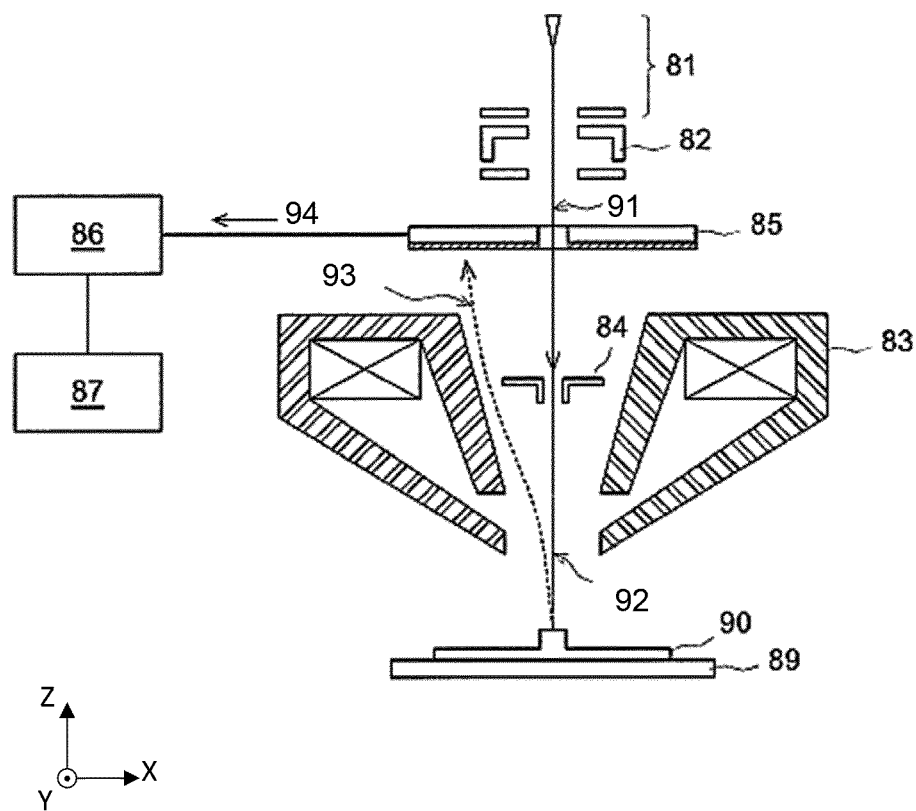
FIG. 20 schematically depicts an embodiment of an electron beam inspection apparatus, according to an embodiment.

FIG. 20 schematically illustrates a further embodiment of an inspection apparatus. The system is used to inspect a sample 90 (such as a substrate) on a sample stage 88 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 88. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 19 that uses a probe to inspect a substrate, the electron current in the system of FIG. 20 is significantly larger compared to, e.g., a CD SEM such as depicted in FIG. 19, such that the probe spot is large enough so that the inspection speed can be fast. However, the resolution may not be as high as compared to a CD SEM because of the large probe spot. In an embodiment, the above discussed inspection apparatus (in FIGS. 7 and 8) may be single beam or a multi-beam apparatus without limiting the scope of the present disclosure.

The SEM images, from, e.g., the system of FIG. 19 and/or FIG. 20, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

Figure 21:
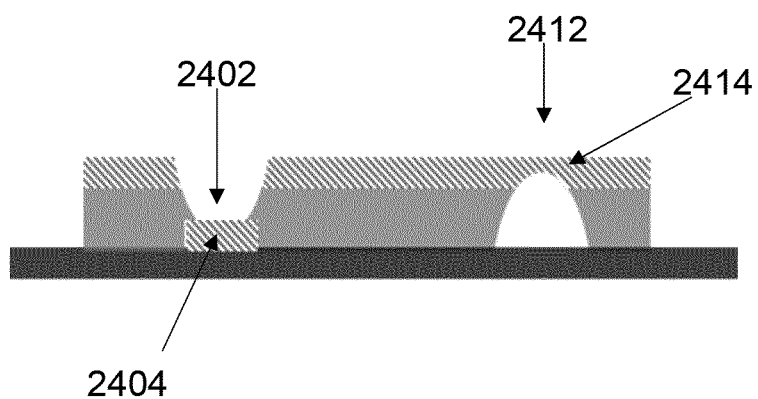
FIG. 21 illustrates example defects on a printed substrate, according to an embodiment.

FIG. 21 illustrates example defects such as a footing 2402 and necking 2412 type of failure may be observed for certain setting of the process variable such as dose/focus. In case of footing, de-scumming may be performed to remove a foot 2404 at the substrate. In case of the necking 2412, a resist thickness may be reduced by removing a top layer 2414. In an embodiment, another ranking criteria may be whether the defects resulting from some hot spots are fixable or not via a post-patterning process. For example, hot spots that lead to defects that may be fixed post-patterning process and occur less frequently than other defects may be ranked substantially lower.

Figure 22:
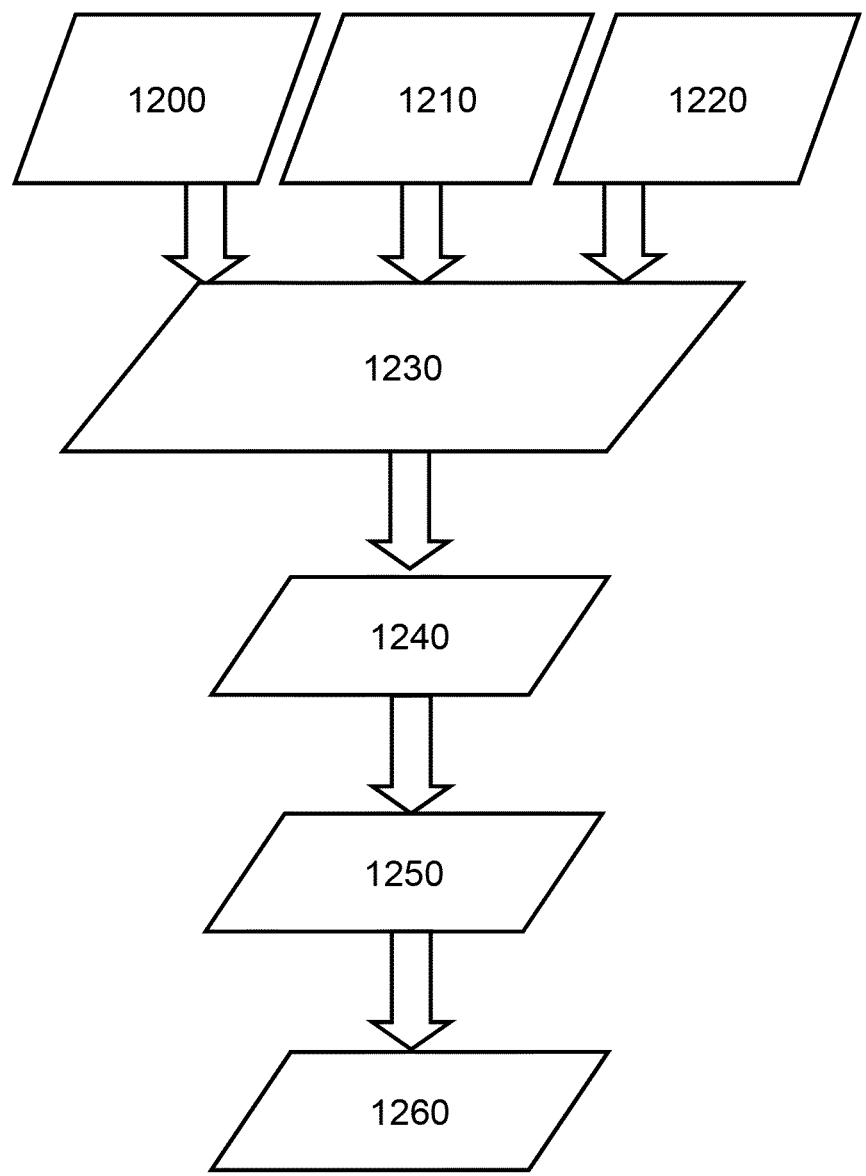
FIG. 22 depicts an example flow chart for modeling and/or simulating at least part of a patterning process, according to an embodiment.

An exemplary flow chart for modelling and/or simulating parts of a patterning process is illustrated in FIG. 22. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma ($\sigma$) settings as well as any particular illumination shape (e.g. off-axis radiation shape such as annular, quadrupole, dipole, etc.), where $\sigma$ (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device/design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

In an embodiment, there is provided a method of training a machine learning model of a patterning process. The method includes obtaining a training data set comprising: (i) a simulated pattern associated with a mask pattern to be printed on a substrate, (ii) inspection data of a printed pattern imaged on the substrate using the mask pattern, and (iii) measured values of a parameter of the patterning process applied during imaging of the mask pattern on the substrate; training, via a processor, the machine learning model based on the training data set to predict a difference in a characteristic of the simulated pattern and the printed pattern.

In an embodiment, the training step is an iterative process involves receiving the inspection data comprising a printed pattern image, and the measured values of the parameter of the patterning process; obtaining, via simulating a patterning process model based on the measured values of the parameter of the patterning process, the simulated pattern; predicting, via the machine learning model, an image corresponding to the simulated pattern; determining the difference between the predicted pattern image and the printed pattern image; and adjusting model parameter values of the machine learning model such that the difference between the predicted pattern image and the printed pattern image is reduced.

In an embodiment, the adjusting of the model parameter values of the machine learning model involves determining a gradient map of the difference between the predicted pattern image and the printed pattern image as a function of a model parameter; identifying the model parameter values based on the gradient map such that the predicted pattern image and the printed pattern image is reduced; and adjusting the model parameter values based on the identified values.

In an embodiment, the simulated pattern is an aerial image, a mask image, a resist image, and/or an etch image.

In an embodiment, obtaining the simulated pattern comprises: simulating the patterning process model using the mask pattern as an input.

In an embodiment, the simulated pattern comprises to a hot spot that is likely to fail when imaged on the substrate.

In an embodiment, the simulated pattern comprises a pattern that does not satisfy a lithography manufacturability check.

In an embodiment, the characteristic of the simulated pattern or the printed pattern is a critical dimension of a feature of the simulated pattern, or a contour of the feature of the simulated pattern.

In an embodiment, the inspection data comprises defect data of the imaged substrate obtained via an inspection apparatus.

In an embodiment, the inspection data is an image of the printed substrate, wherein the image is a scanning electron beam image and/or an optical metrology image.

In an embodiment, the parameter of the patterning process is a dose, and/or a focus.

In an embodiment, the measured values of the parameter of the patterning process is obtained via a metrology tool.

In an embodiment, the machine learning model is a convolutional neural network.

In an embodiment, the adjusting of the model parameter values comprises adjusting values of: one or more weights of a layer of the convolutional neural network, one or more bias of a layer of the convolutional neural network, hyperparameters related to the convolutional neural network, and/or a number of layers of the convolutional neural network.

In an embodiment, there is provided a method of correcting a characteristic of a simulated pattern of a patterning process. The method involves determining, via simulating a patterning process model, the simulated pattern and the characteristic of the simulated pattern; determining, via a trained machine learning model, a characteristic adjustment value for the characteristic of the simulated pattern; and correcting, via a processor, the characteristic of the simulated pattern based on the characteristic adjustment value.

In an embodiment, the method further involves obtaining a plurality of simulated patterns and a plurality of adjustment characteristic values corresponding to the plurality of simulated patterns, via the trained machine learning model; adjusting, via the processor, the characteristic of each of the plurality of simulated patterns based on the plurality of adjustment characteristic values; and determining, via the processor, a ranking of the plurality of simulated patterns based on the adjusted characteristic of the simulated patterns.

In an embodiment, the method further involves determining a sampling plan for metrology of a printed substrate based on the ranking of the plurality of simulated patterns.

In an embodiment, the plurality of simulated patterns comprises patterns corresponding to a plurality of hot spots.

In an embodiment, the sampling plan is based on the ranking of the hot spots.

In an embodiment, the method further involves guiding, via the processor, an inspection apparatus to collect measurement data on the printed substrate based on the ranking of the hot spots; and determining, via the processor, defects on the printed substrate based on the measurement data.

Furthermore, in an embodiment, there is provided a method of training a machine learning model configured to predict ranking of a set simulated patterns of a patterning process. The method involves obtaining (i) the set of simulated patterns corresponding to a set of mask patterns, (ii) defect data of a set of printed patterns imaged on a substrate using the set of mask patterns, and (iii) a sampling plan associated with the substrate imaged using the set of mask pattern; and training, via a processor, the machine learning model based on the defect data and the sampling plan such that the machine learning model is configured to predict a ranking of the set of simulated patterns that matches a reference ranking based on the defect data.

In an embodiment, the training step is an iterative process, an iteration involves predicting, via the machine learning model, the ranking of the set of simulated patterns using the sampling plan and the defect data as input, determining a difference between the predicted ranking and the reference ranking based on the defect data; and adjusting model parameter values of the machine learning model such that the difference between the rankings is reduced.

In an embodiment, obtaining the set of simulated patterns involves simulating a patterning process model using each of a mask pattern in the set of the mask pattern, and identifying, from simulation results, the set of simulated patterns that are likely to fail when imaged on the substrate.

In an embodiment, the set of simulated patterns correspond to a set of hot spots.

In an embodiment, the set of simulated patterns comprises a simulated pattern that does not satisfy a lithography manufacturability check.

In an embodiment, the defect data is a defect count associated with one or more patterns on the printed substrate.

In an embodiment, the defect data is a value or a range of values of a critical dimension associated with the one or more patterns on the printed substrate.

In an embodiment, the defect data is extracted from image of the printed substrate, wherein the image is a scanning electron beam image and/or an optical metrology image.

In an embodiment, the sampling plan involves a set of locations on the printed substrate at which measurements are made, wherein the set of locations are based on an initial ranking of the set of simulated patterns; and/or a number of measurements to be made at one or more locations of the set of locations based on the initial ranking of the set of simulated patterns.

In an embodiment, the method further involves receiving the set of simulated patterns; predicting, via the trained machine learning model, the ranking of the set of simulated patterns; and adjusting, via the processor, the sampling plan based on the predicted ranking of the set of simulated patterns.

In an embodiment, the adjusting of the sampling plan involves adjusting a location of the set of location to be measured; and/or the number of the measurements to be made at one or more locations of the set of location.

In an embodiment, the adjusting the location of the set of location involves omitting a location form the set of locations corresponding to a relatively low ranked simulated pattern; and/or adding a new location to the set of locations corresponding to a relatively high ranked simulated pattern.

In an embodiment, the adjusting the location of the set of location comprises increasing and/or reducing the number of measurements to be made at the location of the subset of locations.

In an embodiment, the method further involves guiding, via the processor, an inspection apparatus to collect measurement data on the printed substrate based on the predicted ranking of the set of simulated patterns; and determining, via the processor, defects on the printed substrate based on the measurement data.

Furthermore, in an embodiment, there is provided a method of determining ranking of a set of simulated patterns of a patterning process. The method involves adjusting, via a first machine learning model, a characteristic of at least one simulated pattern within a set of simulated patterns; determining, via a processor, a subset of the simulated patterns based on the adjusted characteristic of the at least one simulated pattern; and determining, via a second machine learning model, a ranking of the at least one simulated pattern within subset of the simulated patterns.

In an embodiment, determining the subset of the simulated patterns involves determining whether the adjusted characteristic of the at least one simulated pattern satisfy a lithography manufacturability check; and responsive to not satisfying of the lithography manufacturability check, including the at least one simulated pattern in the subset of simulated patterns.

In an embodiment, the method further involves guiding, via the processor, an inspection apparatus to collect measurement data on a printed substrate based on the ranking of the at least one simulated pattern within the subset of simulated patterns; and determining, via a processor, defects on the printed substrate based on the measurement data.

In an embodiment, the characteristic of the at least one simulated pattern or the printed pattern is a critical dimension of a feature of the at least one simulated pattern of the set of simulated patterns.

In an embodiment, there is provided a computer program product comprising a non-transitory computer readable medium having instructions recorded thereon, the instructions when executed by a computer system implementing the aforementioned methods.

Figure 23:
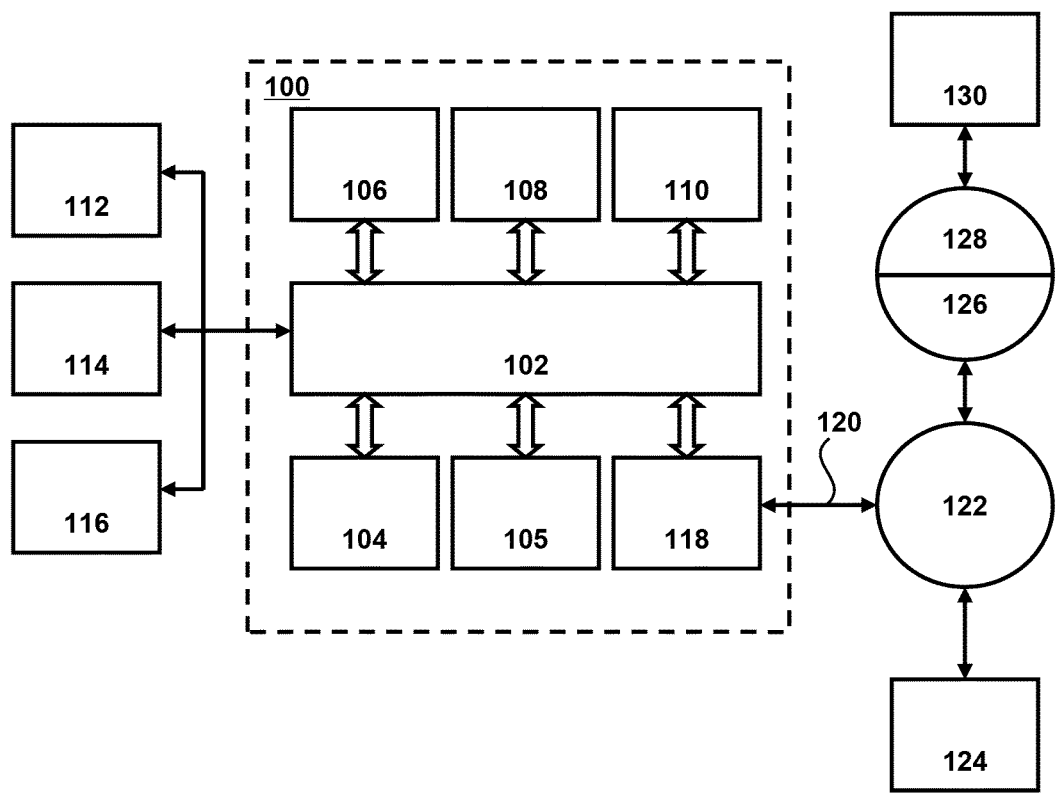
FIG. 23 is a block diagram of an example computer system, according to an embodiment.

FIG. 23 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example.

The received code may be executed by processor 104 as it is received, and/or stored in storage device 110, or other non-volatile storage for later execution. In this manner, computer system 100 may obtain application code in the form of a carrier wave.

Figure 24:
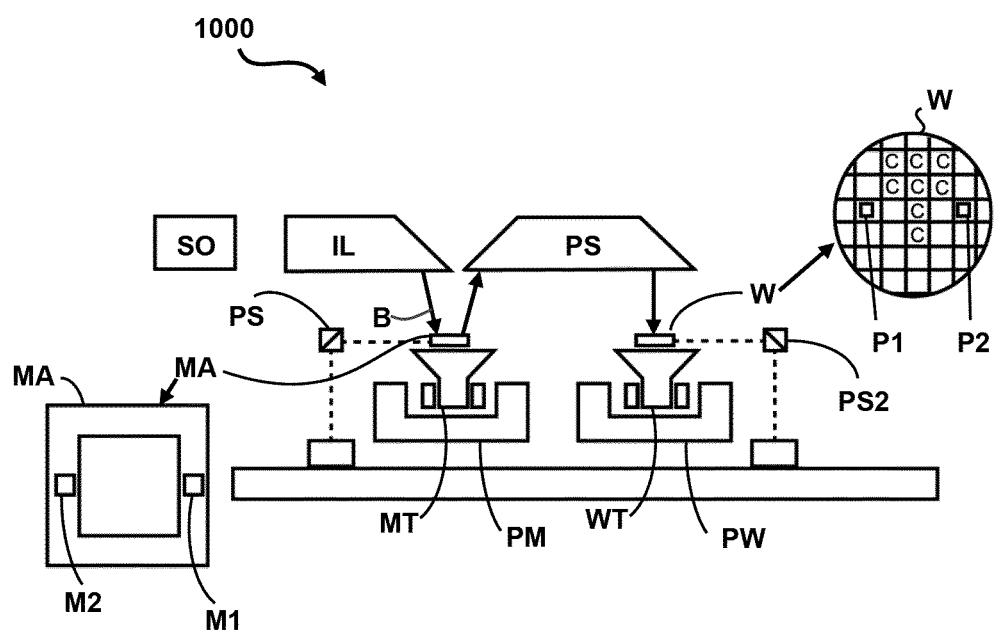
FIG. 24 is a schematic diagram of an extreme ultraviolet (EUV) lithographic projection apparatus, according to an embodiment.

FIG. 24 schematically depicts another exemplary lithographic projection apparatus 1000 that includes:
- a source collector module SO to provide radiation.
- an illumination system (illuminator) IL configured to condition a radiation beam B (e.g. EUV radiation) from the source collector module SO.
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multi-layer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 24, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 24, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 25:
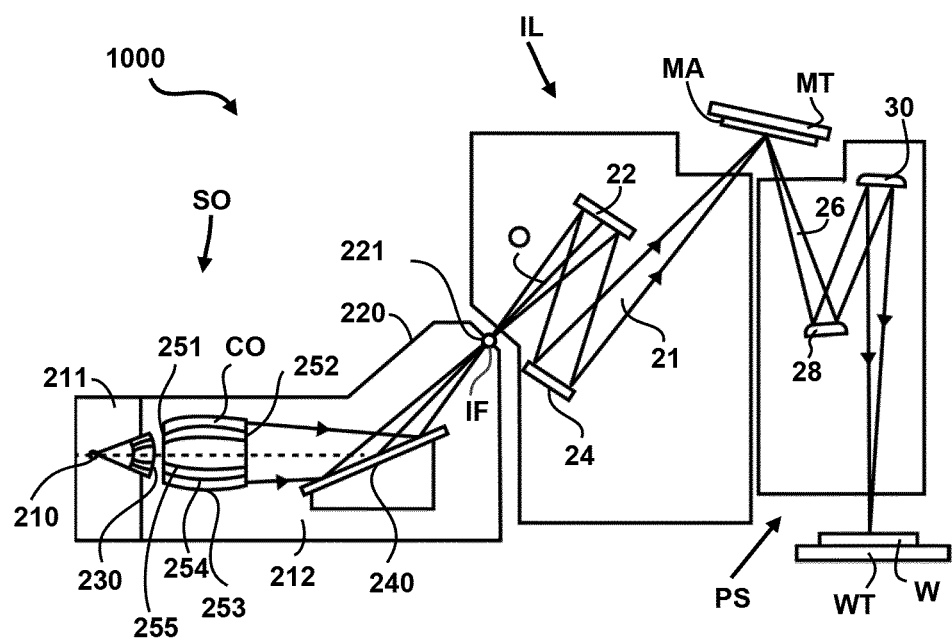
FIG. 25 is a more detailed view of the apparatus in FIG. 24, according to an embodiment.

FIG. 25 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 25.

Collector optic CO, as illustrated in FIG. 25, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 26:
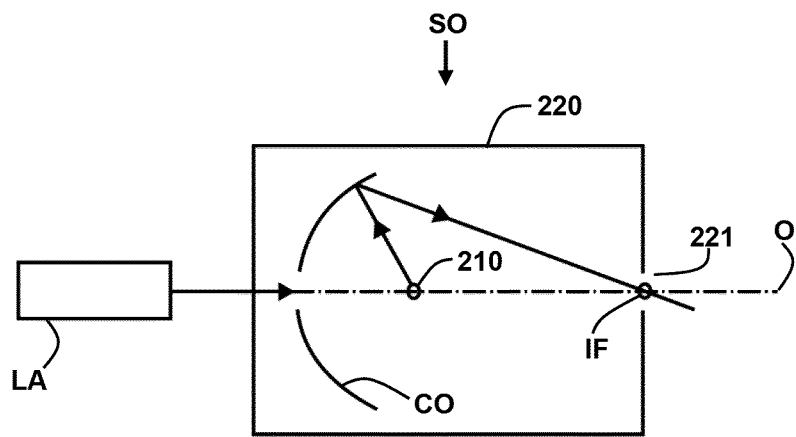
FIG. 26 is a more detailed view of the source collector module of the apparatus of FIG. 24 and FIG. 25, according to an embodiment.

Alternatively, the source collector module SO may be part of an LPP radiation system as shown in FIG. 26. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method of training a machine learning model of a patterning process, the method comprising:
obtaining a training data set comprising: (i) a simulated pattern associated with a mask pattern to be printed on a substrate, (ii) inspection data of a printed pattern imaged on the substrate using the mask pattern, and (iii) measured values of a parameter of the patterning process applied during imaging of the mask pattern on the substrate;
training, via a processor, the machine learning model based on the training data set to predict a difference in a characteristic of the simulated pattern and the printed pattern.

2. The method of clause 1, wherein the training step is an iterative process comprising:
receiving the inspection data comprising a printed pattern image, and the measured values of the parameter of the patterning process;
obtaining, via simulating a patterning process model based on the measured values of the parameter of the patterning process, the simulated pattern;
predicting, via the machine learning model, an image corresponding to the simulated pattern;
determining the difference between the predicted pattern image and the printed pattern image; and
adjusting model parameter values of the machine learning model such that the difference between the predicted pattern image and the printed pattern image is reduced.

3. The method of clause 2, wherein the adjusting of the model parameter values of the machine learning model comprises:
determining a gradient map of the difference between the predicted pattern image and the printed pattern image as a function of a model parameter;
identifying the model parameter values based on the gradient map such that the predicted pattern image and the printed pattern image is reduced; and
adjusting the model parameter values based on the identified values.

4. The method of any of clauses 1-3, wherein the simulated pattern is an aerial image, a mask image, a resist image, and/or an etch image.

5. The method of any of clauses 1-4, wherein obtaining the simulated pattern comprises: simulating the patterning process model using the mask pattern as an input.

6. The method of any of clauses 1-5, wherein the simulated pattern comprises to a hot spot that is likely to fail when imaged on the substrate.

7. The method of any of clauses 1-6, wherein the simulated pattern comprises a pattern that does not satisfy a lithography manufacturability check.

8. The method of any of clauses 1-7, wherein the characteristic of the simulated pattern or the printed pattern is a critical dimension of a feature of the simulated pattern, or a contour of the feature of the simulated pattern.

9. The method of any of clauses 1-8, wherein the inspection data comprises defect data of the imaged substrate obtained via an inspection apparatus.

10. The method of any of clauses 1-9, wherein the inspection data is an image of the printed substrate, wherein the image is a scanning electron beam image and/or an optical metrology image.

11. The method of any of clauses 1-10, wherein the parameter of the patterning process is a dose, and/or a focus.

12. The method of any of clauses 1-11, wherein the measured values of the parameter of the patterning process is obtained via a metrology tool.

13. The method of any of clauses 1-12, wherein the machine learning model is a convolutional neural network.

14. The method of any of clauses 2-13, wherein the adjusting of the model parameter values comprises adjusting values of:

one or more weights of a layer of the convolutional neural network, one or more bias of a layer of the convolutional neural network, hyperparameters related to the convolutional neural network, and/or a number of layers of the convolutional neural network.

15. A method of correcting a characteristic of a simulated pattern of a patterning process, the method comprising:

determining, via simulating a patterning process model, the simulated pattern and the characteristic of the simulated pattern;

determining, via a trained machine learning model, a characteristic adjustment value for the characteristic of the simulated pattern; and correcting, via a processor, the characteristic of the simulated pattern based on the characteristic adjustment value.

16. The method of clause 15, wherein further comprises:

obtaining a plurality of simulated patterns and a plurality of adjustment characteristic values corresponding to the plurality of simulated patterns, via the trained machine learning model;

adjusting, via the processor, the characteristic of each of the plurality of simulated patterns based on the plurality of adjustment characteristic values; and determining, via the processor, a ranking of the plurality of simulated patterns based on the adjusted characteristic of the simulated patterns.

17. The method of any of clauses 15-16, further comprises:

determining a sampling plan for metrology of a printed substrate based on the ranking of the plurality of simulated patterns.

18. The method of any of clauses 15-17, wherein the plurality of simulated patterns comprises patterns corresponding to a plurality of hot spots.

19. The method of any of clauses 15-18, wherein the sampling plan is based on the ranking of the hot spots.

20. The method of any of clauses 15-19, further comprising:

guiding, via the processor, an inspection apparatus to collect measurement data on the printed substrate based on the ranking of the hot spots; and determining, via the processor, defects on the printed substrate based on the measurement data.

21. A method of training a machine learning model configured to predict ranking of a set simulated patterns of a patterning process, the method comprising:

obtaining (i) the set of simulated patterns corresponding to a set of mask patterns, (ii) defect data of a set of printed patterns imaged on a substrate using the set of mask patterns, and (iii) a sampling plan associated with the substrate imaged using the set of mask pattern; and training, via a processor, the machine learning model based on the defect data and the sampling plan such that the machine learning model is configured to predict a ranking of the set of simulated patterns that matches a reference ranking based on the defect data.

22. The method of clause 21, wherein the training step is an iterative process, an iteration comprises:

predicting, via the machine learning model, the ranking of the set of simulated patterns using the sampling plan and the defect data as input;

determining a difference between the predicted ranking and the reference ranking based on the defect data; and adjusting model parameter values of the machine learning model such that the difference between the rankings is reduced.

23. The method of clause 21-22, wherein obtaining the set of simulated patterns comprises:

simulating a patterning process model using each of a mask pattern in the set of the mask pattern, and identifying, from simulation results, the set of simulated patterns that are likely to fail when imaged on the substrate.

24. The method of any of clauses 21-23, wherein the set of simulated patterns correspond to a set of hot spots.

25. The method of any of clauses 21-24, wherein the set of simulated patterns comprises a simulated pattern that does not satisfy a lithography manufacturability check.

26. The method of any of clauses 21-25, wherein the defect data is a defect count associated with one or more patterns on the printed substrate.

27. The method of any of clauses 21-26, wherein the defect data is a value or a range of values of a critical dimension associated with the one or more patterns on the printed substrate.

28. The method of any of clauses 21-27, wherein the defect data is extracted from image of the printed substrate, wherein the image is a scanning electron beam image and/or an optical metrology image.

29. The method of any of clauses 21-28, wherein the sampling plan comprises:

a set of locations on the printed substrate at which measurements are made, wherein the set of locations are based on an initial ranking of the set of simulated patterns; and/or a number of measurements to be made at one or more locations of the set of locations based on the initial ranking of the set of simulated patterns.

30. The method of clause 29, further comprising:

receiving the set of simulated patterns;

predicting, via the trained machine learning model, the ranking of the set of simulated patterns; and adjusting, via the processor, the sampling plan based on the predicted ranking of the set of simulated patterns.

31. The method of clause 30, wherein the adjusting of the sampling plan comprises:

adjusting a location of the set of location to be measured; and/or the number of the measurements to be made at one or more locations of the set of location.

32. The method of clause 31, wherein the adjusting the location of the set of location comprises:

omitting a location form the set of locations corresponding to a relatively low ranked simulated pattern; and/or adding a new location to the set of locations corresponding to a relatively high ranked simulated pattern.

33. The method of clause 31, wherein the adjusting the location of the set of location comprises increasing and/or reducing the number of measurements to be made at the location of the subset of locations.

34. The method of any of clauses 21-33, further comprising:

guiding, via the processor, an inspection apparatus to collect measurement data on the printed substrate based on the predicted ranking of the set of simulated patterns; and determining, via the processor, defects on the printed substrate based on the measurement data.

35. A method of determining ranking of a set of simulated patterns of a patterning process, the method comprising:

adjusting, via a first machine learning model, a characteristic of at least one simulated pattern within a set of simulated patterns;

determining, via a processor, a subset of the simulated patterns based on the adjusted characteristic of the at least one simulated pattern; and determining, via a second machine learning model, a ranking of the at least one simulated pattern within subset of the simulated patterns.

36. The method of clause 35, wherein determining the subset of the simulated patterns comprises:

determining whether the adjusted characteristic of the at least one simulated pattern satisfy a lithography manufacturability check; and responsive to not satisfying of the lithography manufacturability check, including the at least one simulated pattern in the subset of simulated patterns.

37. The method of any of clauses 35-36, further comprising:

guiding, via the processor, an inspection apparatus to collect measurement data on a printed substrate based on the ranking of the at least one simulated pattern within the subset of simulated patterns; and determining, via a processor, defects on the printed substrate based on the measurement data.

38. The method of any of clauses 35-37, wherein the characteristic of the at least one simulated pattern or the printed pattern is a critical dimension of a feature of the at least one simulated pattern of the set of simulated patterns.

39. A computer program product comprising a non-transitory computer readable medium having instructions recorded thereon, the instructions when executed by a computer system implementing the method of any of clauses 1-38.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multilayer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method comprising:
   obtaining a training data set comprising: (i) a simulated pattern associated with a mask pattern to be printed on a substrate, (ii) inspection data of a printed pattern imaged on the substrate using the mask pattern, and (iii) measured values of a parameter of the patterning process applied during imaging of the mask pattern on the substrate; and
   training, by a hardware processor system, a machine learning model for the patterning process based on the training data set to predict a difference in a characteristic of the simulated pattern and the printed pattern.

2. The method of claim 1, wherein the training is an iterative process comprising:
   receiving the inspection data comprising a printed pattern image, and the measured values of the parameter of the patterning process;
   obtaining, via simulating using a patterning process model and based on the measured values of the parameter of the patterning process, the simulated pattern;
   predicting, via the machine learning model, an image corresponding to the simulated pattern;
   determining the difference between the predicted image and the printed pattern image; and
   adjusting one or more model parameter values of the machine learning model such that the difference between the predicted image and the printed pattern image is reduced.

3. The method of claim 2, wherein the adjusting of the one or more model parameter values of the machine learning model comprises:
   determining a gradient map of the difference between the predicted image and the printed pattern image as a function of a model parameter;
   identifying the one or more model parameter values based on the gradient map such that the difference between the predicted image and the printed pattern image is reduced; and
   adjusting the one or more model parameter values based on the identified values.

4. The method of claim 2, wherein the machine learning model is a convolutional neural network.

5. The method of claim 4, wherein the adjusting of the one or more model parameter values comprises adjusting one or more selected from:
   one or more weights of a layer of the convolutional neural network,
   one or more biases of a layer of the convolutional neural network,
   one or more hyperparameters related to the convolutional neural network, and/or
   a number of layers of the convolutional neural network.

6. The method of claim 1, wherein the simulated pattern is an aerial image, a mask image, a resist image, and/or an etch image.

7. The method of claim 1, wherein obtaining the simulated pattern comprises performing a simulation, using a patterning process model and using the mask pattern as an input, to produce the simulated pattern.

8. The method of claim 1, wherein the simulated pattern comprises a hot spot that is likely to fail when imaged on the substrate.

9. The method of claim 1, wherein the simulated pattern comprises a pattern that does not satisfy a lithography manufacturability check.

10. The method of claim 1, wherein the characteristic of the simulated pattern or the printed pattern is a critical dimension of a feature of the simulated pattern, or a contour of a feature of the simulated pattern.

11. The method of claim 1, wherein the inspection data comprises defect data of the imaged substrate obtained via an inspection apparatus.

12. The method of claim 1, wherein the inspection data is an image of the printed substrate, wherein the image is a scanning electron beam image and/or an optical metrology image.

13. The method of claim 1, wherein the parameter of the patterning process is a dose and/or a focus.

14. The method of claim 1, wherein the measured values of the parameter of the patterning process are obtained via a metrology tool.

15. A computer program product comprising a non-transitory computer readable medium having instructions therein, the instructions, when executed by a computer system, configured to cause the computer system to at least:
    obtain a training data set comprising: (i) a simulated pattern associated with a mask pattern to be printed on a substrate, (ii) inspection data of a printed pattern imaged on the substrate using the mask pattern, and (iii) measured values of a parameter of a patterning process applied during imaging of the mask pattern on the substrate; and
    train a machine learning model of the patterning process based on the training data set to predict a difference in a characteristic of the simulated pattern and the printed pattern.

16. The computer program product of claim 15, wherein the instructions configured to train a machine learning model are configured to do so iteratively and to cause the computer system to:
    receive the inspection data comprising a printed pattern image, and the measured values of the parameter of the patterning process;
    obtain, via simulation using a patterning process model and based on the measured values of the parameter of the patterning process, the simulated pattern;
    predict, via the machine learning model, an image corresponding to the simulated pattern;
    determine the difference between the predicted image and the printed pattern image; and
    adjust one or more model parameter values of the machine learning model such that the difference between the predicted image and the printed pattern image is reduced.

17. The computer program product of claim 16, wherein the instructions configured to adjust one or more model parameter values of the machine learning model are configured to cause the computer system to:

determine a gradient map of the difference between the predicted image and the printed pattern image as a function of a model parameter;

identify the one or more model parameter values based on the gradient map such that the difference between the predicted image and the printed pattern image is reduced; and adjust the one or more model parameter values based on the identified values.

18. The computer program product of claim 16, wherein the machine learning model is a convolutional neural network.

19. The computer program product of claim 18, wherein adjustment of the one or more model parameter values comprises adjustment of one or more selected from:

one or more weights of a layer of the convolutional neural network, one or more biases of a layer of the convolutional neural network, one or more hyperparameters related to the convolutional neural network, and/or a number of layers of the convolutional neural network.

20. The computer program product of claim 15, wherein the simulated pattern comprises a hot spot that is likely to fail when imaged on the substrate and/or comprises a pattern that does not satisfy a lithography manufacturability check.

* * * * *